(12) United States Patent
Ruff et al.

(10) Patent No.: US 9,407,284 B2
(45) Date of Patent: Aug. 2, 2016

(54) IMPROVEMENTS FOR BASE64 ENCODING AND DECODING

(71) Applicant: NUMBERGUN LLC, Salt Lake City, UT (US)

(72) Inventors: Eric J. Ruff, Charlotte, NC (US); John W. Ogilvie, Sandy, UT (US)

(73) Assignee: John W. Ogilvie, Sandy, UT (US)

( * ) Notice: Subject to any disclaimer, the term of this patent is extended or adjusted under 35 U.S.C. 154(b) by 0 days.

(21) Appl. No.: 14/772,365

(22) PCT Filed: Mar. 7, 2014

(86) PCT No.: PCT/US2014/022021
§ 371 (c)(1),
(2) Date: Sep. 2, 2015

(87) PCT Pub. No.: WO2014/150056
PCT Pub. Date: Sep. 25, 2014

(65) Prior Publication Data
US 2016/0020782 A1    Jan. 21, 2016

Related U.S. Application Data

(60) Provisional application No. 61/799,489, filed on Mar. 15, 2013, provisional application No. 62/058,362, filed on Oct. 1, 2014.

(51) Int. Cl.
*H03M 7/00* (2006.01)
*H03M 5/14* (2006.01)
(Continued)

(52) U.S. Cl.
CPC ........... *H03M 5/145* (2013.01); *G06F 17/2217* (2013.01); *G06F 17/30* (2013.01); *H03M 7/14* (2013.01); *H03M 7/30* (2013.01); *H03M 7/4056* (2013.01); *H03M 7/6011* (2013.01)

(58) Field of Classification Search
CPC . H03M 5/145; H03M 7/4056; H03M 7/6011; H03M 7/14; H03M 7/30; G06F 17/2217; G06F 17/30
USPC ................................................. 341/95, 50, 51
See application file for complete search history.

(56) References Cited

U.S. PATENT DOCUMENTS 3,830,965 A    8/1974    Beaudette
4,121,259 A    10/1978    Preuss et al.
(Continued)

OTHER PUBLICATIONS

"c++—64bit integer conversion from string—Stack Overflow", retrieved from <<http://stackoverflow.com/questions/8223814/64bit-integer-conversion-from-string>>, 2011, 2 pages.
(Continued)

*Primary Examiner* — Jean B Jeanglaude
(74) *Attorney, Agent, or Firm* — Ogilvie Law Firm

(57) ABSTRACT

Base64 encoding and decoding advances are characterized. Some embodiments rely on only a single bit shifting operation; some have no reliance on bit-shifting. Some access data source bytes with multi-byte reads, and use those data source bytes as indexes into an encoding lookup table. Some use a table with four quadrants, each of which contains a copy of the same 64 encoding values. Some use a negative value as both a counter and an index. Some exclude BSWAP instructions even with a little-endian processor. Some partition a data source into N partitions, which are then encoded or decoded concurrently. In some, partition length is based on expected processor performance. Unrolled loops, exemplary assembly language code and coding choices, division using Magic-Number multiplication, terminal null addition, encoding/decoding applications, and other examples are also presented.

18 Claims, 5 Drawing Sheets

(51) Int. Cl.
*G06F 17/30* (2006.01)
*G06F 17/22* (2006.01)
*H03M 7/30* (2006.01)
*H03M 7/14* (2006.01)
*H03M 7/40* (2006.01)

(56) References Cited

U.S. PATENT DOCUMENTS

| | | |
|---|---|---|
| 4,420,771 A | 12/1983 | Pirsch |
| 5,444,445 A | 8/1995 | Chu |
| 6,166,666 A | 12/2000 | Kadyk |
| 7,982,637 B2 | 7/2011 | Joyce |
| 8,019,081 B2 | 9/2011 | Little et al. |
| 8,060,414 B1 | 11/2011 | Lin et al. |
| 8,775,927 B2 | 7/2014 | Dirstine |
| 8,908,058 B2 | 12/2014 | Akeley et al. |
| 2008/0122663 A1* | 5/2008 | Luo ............... H03M 7/14 341/51 |
| 2012/0030375 A1* | 2/2012 | Schulenburg ....... G06F 17/2217 709/246 |

OTHER PUBLICATIONS

"Base64", retrieved from <<http://en.wikipedia.org/wiki/Base64>>, Nov. 27, 2012, 9 pages.

* cited by examiner

Table of Some Suitable MagicNumbers

| Divisor | MagicNumber | # Bits | Shift | Max Input |
|---|---|---|---|---|
| These MagicNumbers are for 32-bit binary integers: | | | | |
| $10^1$ | 0x1999999a | 32 | 32 | $10^9$ |
| $10^1$ | 0xccccccccd | 32 | 35 | (1 << 32) - 1 |
| $10^2$ | 0x028f5c29 | 32 | 32 | $10^9$ |
| $10^2$ | 0x51eb851f | 32 | 37 | (1 << 32) - 1 |
| $10^3$ | 0x00418938 | 32 | 32 | $10^6$ |
| $10^3$ | 0x10624DD3 | 32 | 38 | (1 << 32) -1 |
| $10^6$ | 0x431BDE83 | 32 | 50 | $10^9$ |
| $10^9$ | 0x1:12E0BE83 | 64 | 62 | (1 << 32) − 1 |
| These MagicNumbers are for 64-bit binary integers: | | | | |
| $10^9$ | 0x4:4b82fa0a | 64 | 64 | $19 * 10^9$ |
| $10^9$ | 0x89:0x705f4137 | 64 | 69 | $10^{12}$ |
| $10^9$ | 0x225c1:0x7d04dad3 | 64 | 79 | $10^{15}$ |
| $10^9$ | 0x112e0be8:0x26d694b3 | 64 | 90 | $10^{18}$ |
| $10^9$ | 0x1:0x12e0be82:0x6d694b2f | 96 | 94 | (1 << 64) - 1 |

Fig. 3

IMPROVEMENTS FOR BASE64 ENCODING AND DECODING

COPYRIGHT AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

In particular, and without excluding other material, this patent document contains original assembly language listings, tables, and other works, which are individually and collectively subject to copyright protection. The assignee of patent rights, John Ogilvie, is also assignee of the copyrights, including without limitation those marked as Copyright NumberGun LLC, 2012, All Rights Reserved.

BACKGROUND

Acronyms used in this Background and other portions of this document are defined below in the Detailed Description section.

This Background is based on a Wikipedia article titled "Base64", which is assumed to be largely correct but whose accuracy has not been independently verified by the authors of this patent document. In the Wikipedia article, "Base64" refers to a group of similar binary-to-text encoding schemes that represent binary data in an ASCII string format by translating it into a radix-64 representation. The Base64 term originates from a specific MIME content transfer encoding. Base64 encoding schemes are commonly used to encode binary data to be stored and transferred over media that are designed to deal with textual data. This helps ensure that the data remain intact without modification during transport. Base64 is commonly used in a number of applications including email via MIME, and storing complex data in XML.

The particular choice of character set selected for the 64 characters required for the base varies between implementations. The general rule is to choose a set of 64 characters that is both part of a subset common to most encodings, and also printable. This combination leaves the data unlikely to be modified in transit through information systems, such as email, that were traditionally not 8-bit clean. For example, MIME's Base64 implementation uses A-Z, a-z, and 0-9 for the first 62 values. Other variations, usually derived from Base64, share this property but differ in the symbols chosen for the last two values; an example is UTF-7.

The earliest instances of this type of encoding were created for dialup communication between systems running the same OS—e.g. uuencode, BinHex for the TRS-80 (later adapted for Macintosh® computers, mark of Apple, Inc.)—and could therefore make more assumptions about what characters were safe to use. For instance, uuencode uses uppercase letters, digits, and many punctuation characters, but no lowercase, since it was sometimes used with terminals that did not support distinct letter case.

When the number of bytes to encode is not divisible by 3 (that is, if there are only one or two bytes of input for the last block), then the following action is performed: Add extra bytes with value zero so there are three bytes, and perform the conversion to base64. If there was only one significant input byte, only the first two base64 digits are picked, and if there were two significant input bytes, the first three base64 digits are picked. '=' characters might be added to make the last block contain four base64 characters. As a result, when the last group contains one octet, the four least significant bits of the final 6-bit block are set to zero; and when the last group contains two octets, the two least significant bits of the final 6-bit block are set to zero.

As to padding, the '==' sequence indicates that the last group contained only 1 byte, and '=' indicates that it contained 2 bytes. The number of output bytes per input byte is approximately 4/3 (33% overhead) and converges to that value for a large number of bytes. From a theoretical point of view, the padding character is not needed, since the number of missing bytes can be calculated from the number of Base64 digits. In some implementations, the padding character is mandatory, while for others it is not used. One case where padding characters are often required is when multiple Base64 encoded files are concatenated.

The Wikipedia article states that implementations may have some constraints on the alphabet used for representing some bit patterns. This notably concerns the last two characters used in the index table for index 62 and 63, and the character used for padding (which may be mandatory in some protocols, or removed in others). A table in the Wikipedia article summarizes known variants. Among them, the Char for index 62 may be '+', '-', '.', '_', or '!'; the Char for index 63 may be '/', '-', '~', or ':'; the pad char may be mandatory '=', none, or optional URL encoding %3D; line length may be variable or fixed; the maximum encoded line length may be 64, 76, application-dependent, filesystem-dependent, language/system-dependent, or XML parser-dependent; line separators may be CR plus LF, or none; characters outside the index table may be either forbidden or accepted but discarded; and line checksums may be absent or a 24-bit CRC which is Radix-64 encoded including one pad character.

According to the Wikipedia article, the first known standardized use of the encoding now called MIME Base64 was in the PEM protocol, proposed by RFC 989 in 1987. PEM defines a "printable encoding" scheme that uses Base64 encoding to transform an arbitrary sequence of octets to a format that can be expressed in short lines of 6-bit characters, as required by transfer protocols such as SMTP. The current version of PEM (specified in RFC 1421) uses a 64-character alphabet consisting of upper- and lower-case Roman letters (A-Z, a-z), the numerals (0-9), and the "+" and "/" symbols. The "=" symbol is also used as a special suffix code. The original specification, RFC 989, additionally used the "*" symbol to delimit encoded but unencrypted data within the output stream.

To convert data to PEM printable encoding, the first byte is placed in the most significant eight bits of a 24-bit buffer, the next in the middle eight, and the third in the least significant eight bits. If there are fewer than three bytes left to encode (or in total), the remaining buffer bits will be zero. The buffer is then used, six bits at a time, most significant first, as indices into the string: "ABCDEFGHIJKLMNOPQRSTUVWXYZabcdefghijklmnopqrstuvwxyz0123456789+/", and the indicated character is output. The process is repeated on the remaining data until fewer than four octets remain. If three octets remain, they are processed normally. If fewer than three octets (24 bits) are remaining to encode, the input data is right-padded with zero bits to form an integral multiple of six bits. After encoding the non-padded data, if two octets of the 24-bit buffer are padded-zeros, two "=" characters are appended to the output; if one octet of the 24-bit buffer is filled with padded-zeros, one "=" character is appended. This signals the decoder that the zero bits added due to padding should be excluded from the reconstructed data. This also guarantees that the encoded output length is a multiple of 4 bytes. PEM requires that all encoded lines consist of exactly 64 printable characters, with the exception of the last line, which may contain fewer printable characters. Lines are delimited by whitespace characters according to local (platform-specific) conventions.

The MIME specification lists Base64 as one of two binary-to-text encoding schemes (the other being quoted-printable). MIME's Base64 encoding is based on that of the RFC 1421 version of PEM: it uses the same 64-character alphabet and encoding mechanism as PEM, and uses the "=" symbol for output padding in the same way, as described at RFC 1521. MIME does not specify a fixed length for Base64-encoded lines, but it does specify a maximum line length of 76 characters. Additionally it specifies that any extra-alphabetic characters are ignored by a compliant decoder, although most implementations use a CR/LF newline pair to delimit encoded lines. Thus, the actual length of MIME-compliant Base64-encoded binary data is usually about 137% of the original data length, though for very short messages the overhead can be much higher due to the overhead of the headers. Very roughly, the final size of Base64-encoded binary data is equal to 1.37 times the original data size+814 bytes (for headers). In other words, the size of the decoded data can be approximated with this formula: bytes=(string_length(encoded_string)−814)/1.37.

UTF-7, described first in RFC 1642, which was later superseded by RFC 2152, introduced a system called modified Base64. This data encoding scheme is used to encode UTF-16 as ASCII characters for use in 7-bit transports such as SMTP. It is a variant of the Base64 encoding used in MIME. The Modified Base64 alphabet consists of the MIME Base64 alphabet, but does not use the "=" padding character. UTF-7 is intended for use in mail headers (defined in RFC 2047), and the "=" character is reserved in that context as the escape character for "quoted-printable" encoding. Modified Base64 simply omits the padding and ends immediately after the last Base64 digit containing useful bits leaving up to three unused bits in the last Base64 digit.

OpenPGP, described in RFC 4880, describes Radix-64 encoding, also known as "ASCII Armor". Radix-64 is identical to the Base64 encoding described from MIME, with the addition of an optional 24-bit CRC. The checksum is calculated on the input data before encoding; the checksum is then encoded with the same Base64 algorithm and, using an additional "=" symbol as separator, appended to the encoded output data.

According to the Wikipedia article, RFC 3548 is an informational (non-normative) memo that attempts to unify the RFC 1421 and RFC 2045 specifications of Base64 encodings, alternative-alphabet encodings, and the seldom-used Base32 and Base16 encodings. RFC 3548 forbids implementations from generating messages containing characters outside the encoding alphabet or without padding, unless they are written to a specification that refers to RFC 3548 and specifically requires otherwise; it also declares that decoder implementations reject data that contain characters outside the encoding alphabet, unless they are written to a specification that refers to RFC 3548 and specifically requires otherwise. RFC 4648 obsoletes RFC 3548 and focuses on Base64/32/16, e.g., commonly used Base64, Base32, and Base16 encoding schemes, the use of line-feeds in encoded data, use of padding in encoded data, use of non-alphabet characters in encoded data, use of different encoding alphabets, and canonical encodings.

Another variant called modified Base64 for filenames uses '-' instead of '/', because Unix and Windows filenames cannot contain '/'. It could be recommended to use the modified Base64 for URL instead, since then the filenames could be used in URLs also. More generally, Base64 encoding can be helpful when fairly lengthy identifying information is used in an HTTP environment. For example, a database persistence framework for Java objects might use Base64 encoding to encode a relatively large unique id (generally 128-bit UUIDs) into a string for use as an HTTP parameter in HTTP forms or HTTP GET URLs. Also, many applications need to encode binary data in a way that is convenient for inclusion in URLs, including in hidden web form fields, and Base64 is a convenient encoding to render them in a compact way.

According to the Wikipedia article, using standard Base64 in URLs requires encoding of '+', '/' and '=' characters into special percent-encoded hexadecimal sequences ('+'='%2B', '/'='%2F' and '='='%3D'), which makes the string unnecessarily longer. For this reason, modified Base64 for URL variants exist, where the '+' and '/' characters of standard Base64 are respectively replaced by '−' and '_', so that using URL encoders/decoders are no longer necessary and have no impact on the length of the encoded value, leaving the same encoded form intact for use in relational databases, web forms, and object identifiers in general. Some variants allow or require omitting the padding '=' signs to avoid them being confused with field separators, or require that any such padding be percent-encoded. There are other variants that use '_−' or '._' when the Base64 variant string is to be used within valid identifiers for programs.

XML identifiers and name tokens are encoded using two variants: '.−' for use in XML name tokens (Nmtoken), or '_:' for use in more restricted XML identifiers (Name).

Another variant called modified Base64 for regexps uses '!−' instead of '*−' to replace the standard Base64 '+/', because both '+' and '*' may be reserved for regular expressions (note that '[ ]' used in the IRCu variant above would not work in that context).

According to the Wikipedia article, atob( ) and btoa( ) methods defined in a HTML5 draft specification provide Base64 encoding and decoding functionality to web pages. The atob( ) method is unusual in that it does not ignore whitespace or new lines, throwing an INVALID_CHARACTER_ERR instead. The btoa( ) method outputs padding characters, but these are optional in the input of the atob( ) method.

According to the Wikipedia article, Base64 can be used in a variety of contexts. For example, Base64 can be used to transmit and store text that might otherwise cause delimiter collision. Spammers use Base64 to evade basic anti-spamming tools, which often do not decode Base64 and therefore cannot detect keywords in encoded messages. Base64 is used for PHP obfuscation. Base64 is used to encode character strings in LDIF files. Base64 is often used to embed binary data in an XML file, using a syntax similar to, e.g. favicons in Firefox's bookmarks.html. Base64 is used to encode binary files such as images within scripts, to avoid depending on external files. The data URI scheme can use Base64 to represent file contents. For instance, background images and fonts can be specified in a CSS stylesheet file as data: URIs, instead of being supplied in separate files.

SUMMARY

Improvements for use in Base64 encoding and/or decoding are described; the improvements may be implemented in processes, systems, and configured computer-readable storage media, for example. Some embodiments are characterized in at least one of the following ways:

(a) the embodiment includes instructions for a Base64 encoding process which relies on only a single bit shifting operation;

(b) the embodiment includes instructions for a Base64 encoding process which does not rely on any bit shifting operation (that is, bit shifting may be present in an encoding implementation but it can be removed without decreasing encoding performance);

(c) the embodiment includes instructions for a Base64 encoding process which does not rely on any bit shifting operation of data source bytes that are accessed in a single multi-byte read operation prior to using those data source bytes as indexes into an encoding lookup table;

(d) the embodiment includes instructions for a Base64 encoding process which accesses source data bytes multiple bytes at a time and then encodes those accessed bytes before accessing additional multiple bytes and then encoding those accessed bytes;

(e) the embodiment includes tables which effectively shift bits from 8-bit sources into location for 6-bit output, thereby avoiding shift operations in instructions for a Base64 encoding process;

(f) the embodiment includes instructions for a Base64 encoding process which adds one or two nulls at the end of a data source;

(g) the embodiment includes instructions for Base64 encoding according to a set of 64 encoding values, and the at least one table includes a table having four quadrants, each of which contains a copy of the same 64 encoding values;

(h) the embodiment includes instructions for performing a Base64 encoding process which uses a counter register of the processor as an index;

(i) the embodiment includes instructions for performing a Base64 encoding process which uses a negative value for a counter register which is simultaneously used as an index;

(j) the embodiment includes instructions for performing a Base64 decoding process which uses a counter register of the processor as an index;

(k) the embodiment includes instructions for performing a Base64 decoding process which uses a negative value for a counter register which is simultaneously used as an index;

(l) the processor is a little-endian processor, and the embodiment includes table(s) which effectively eliminate any need for a BSWAP command in instructions for a Base64 encoding process;

(m) the embodiment includes data source partitioning instructions which partition a data source into N partitions, N being an integer greater than 1, with each of the first N−1 partitions having a length in bytes which is a multiple of three, and the embodiment also includes encoding concurrency instructions which Base64-encode the partitions concurrently (that is, during overlapping time periods);

(n) the embodiment includes data source partitioning instructions which partition a data source into N partitions of data, and the length of each partition is calculated based on a relative expected performance of a processor to which the partition of data will be sent for encoding; or (o) the embodiment includes one or more other features, improvements, optimizations, exclusion choices (e.g., nonreliance on specified instructions or steps, or avoidance of specified items), steps, tables, or other characterizations described herein.

The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

FIG. 3 is a table showing some MagicNumber values for use in performing division more efficiently by a multiplication.

DETAILED DESCRIPTION

Figure 1:
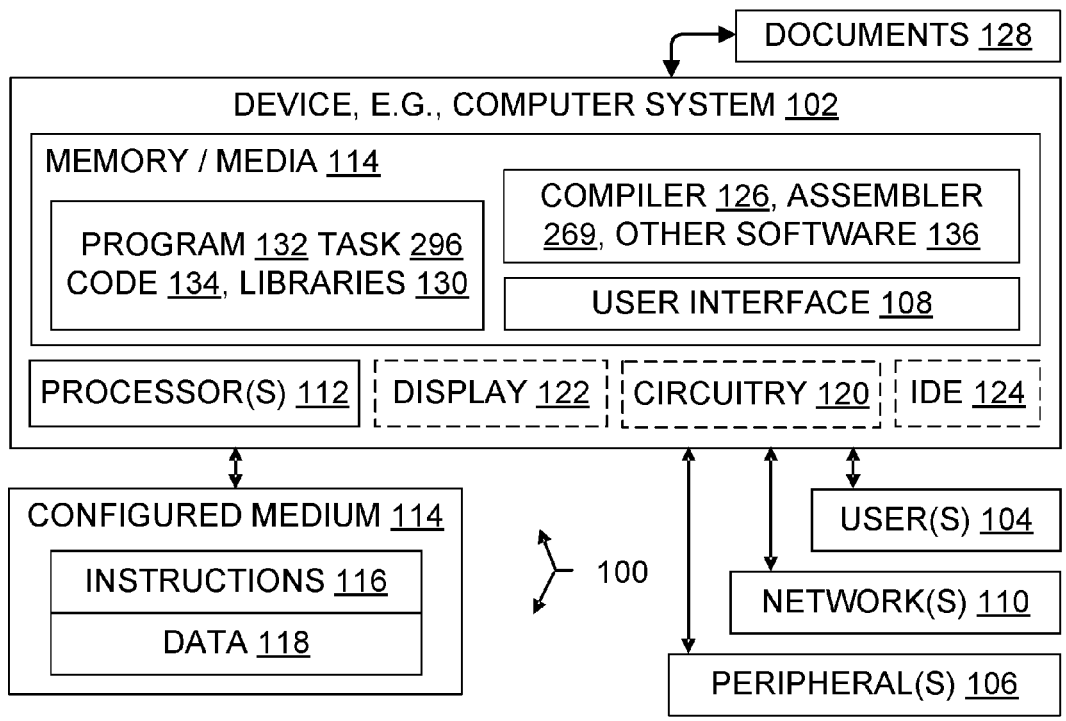
FIG. 1 is a block diagram illustrating a computer system having at least one processor and at least one memory which interact with one another under the control of software and/or circuitry, and other items in an operating environment which may be present on multiple network nodes, and also illustrating configured storage medium (as opposed to a mere signal) embodiments.
Figure 2:
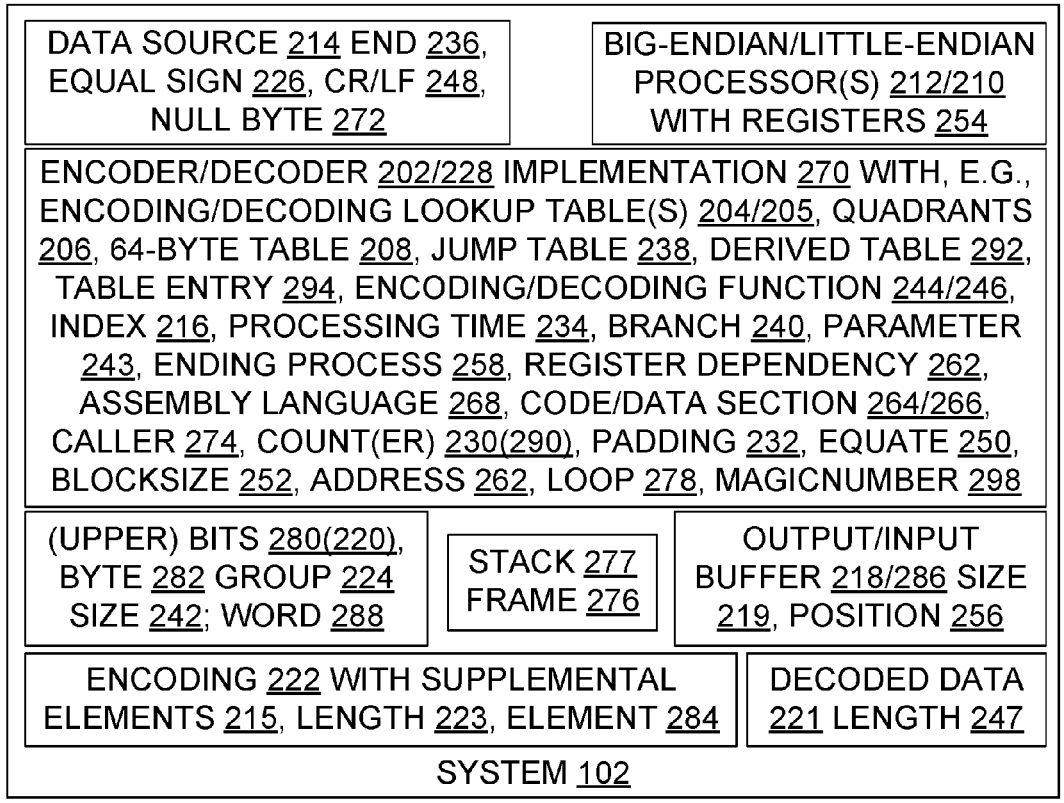
FIG. 2 is a block diagram further illustrating aspects of some embodiments.
Figure 4:
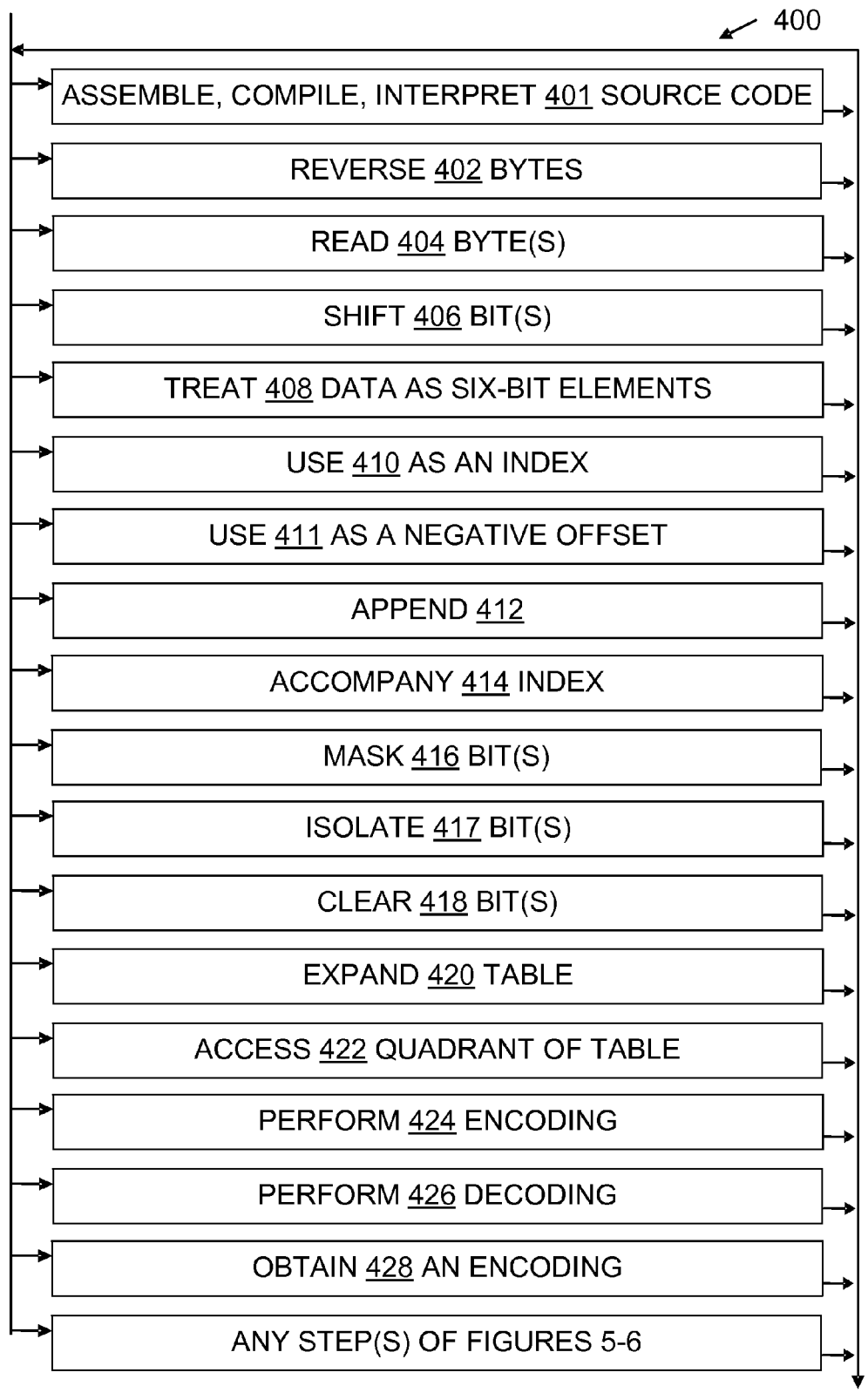
FIGS. 4 through 6 collectively show a flow chart illustrating steps of some process and configured storage medium embodiments.
Figure 5:
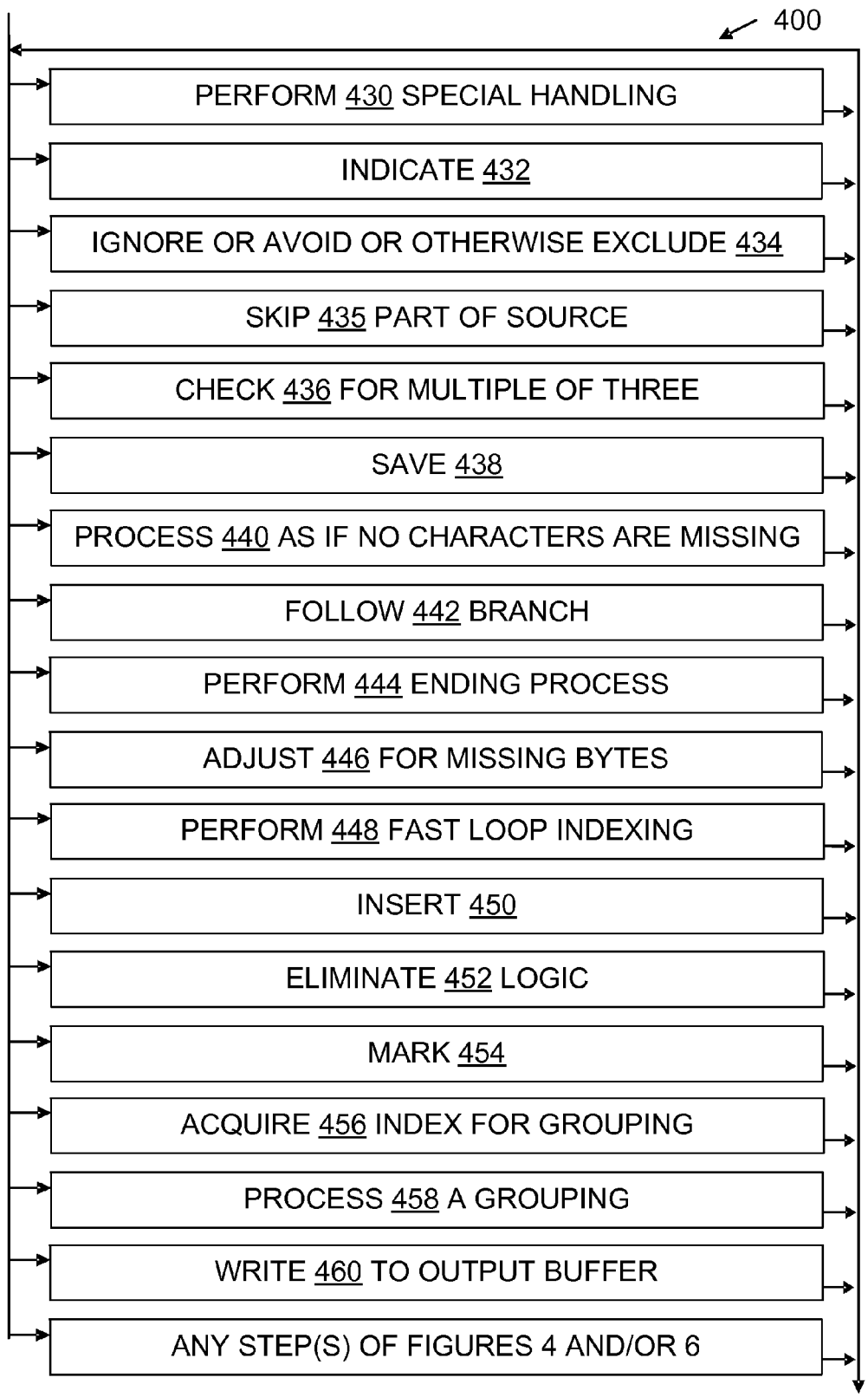
Figure 6:
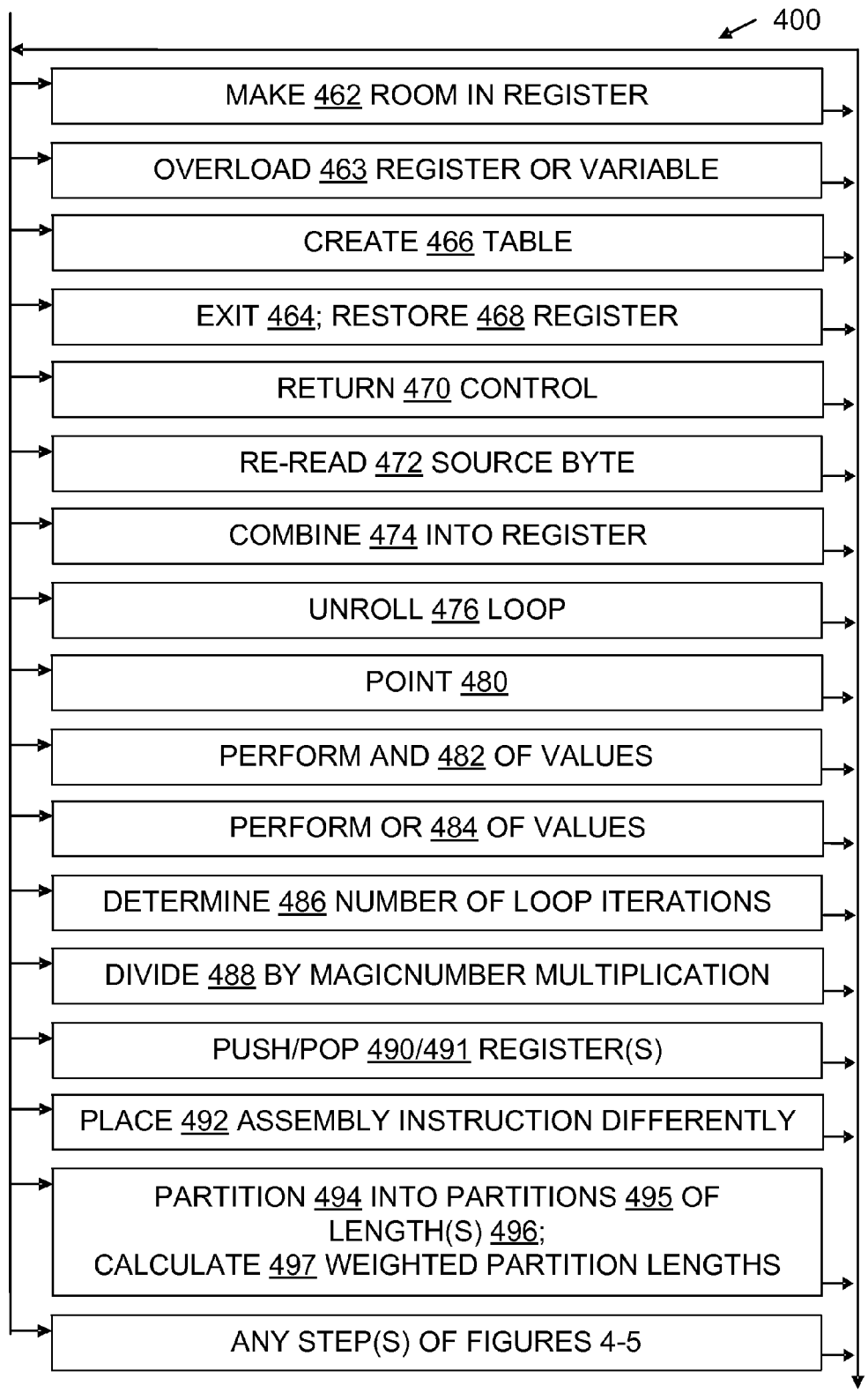

Some acronyms are defined below; others are defined elsewhere herein.

ASCII: American Standard Code for Information Interchange
AVX: Advanced Vector Extensions
CR: Carriage Return
CRC: Cyclic Redundancy Check
CSS: Cascading Style Sheets
HTML5: Hypertext Markup Language, revision 5
HTTP: Hypertext Transfer Protocol
HTTP GET: HTTP GET method
IRC: Internet Relay Chat
LDAP: Lightweight Directory Access Protocol
LDIF: LDAP Data Interchange Format
LF: Line Feed
MIME: Multipurpose Internet Mail Extensions
MMX: MultiMedia Extensions
OpenPGP: Open Pretty Good Privacy
PEM: Privacy-enhanced Electronic Mail
PHP: PHP Hypertext Preprocessor (was Personal Home Page)
RFC: Request for Comments
SIMD: Single Instruction Multiple Data
SMTP: Simple Mail Transfer Protocol
SSE: Streaming SIMD Extension
TRS-80: Tandy/Radio Shack, Z-80 microprocessor
UNIX: registered trademark of The Open Group that refers to a family of computer operating systems and tools
URI: Uniform Resource Identifier
URL: Uniform Resource Locator
UTF-7: 7-bit Unicode Transformation Format
XML: eXtensible Markup Language
XMM: processor registers used by some SSE instructions The technical character of embodiments described herein will be apparent to one of ordinary skill in the art, and will also be apparent in several ways to a wide range of attentive readers. First, some embodiments address the technical problem of excessive time spent in encoding or decoding functions, which detracts from the core calculations of a program—a server for example should spend as much processing resource as possible on serving instead of spending cycles on encoding or decoding data for transmission.

Second, some embodiments include technical components such as computing hardware which interacts with software in a manner beyond the typical interactions within a general purpose computer. For example, in addition to normal interaction such as memory allocation in general, memory reads and writes in general, instruction execution in general, and some sort of I/O, some embodiments described herein perform Base64 encoding and/or decoding.

Third, technical effects provided by some embodiments include the extreme reduction or even the elimination of instructions within an encoding function and/or decoding function implementation, e.g., BSWAP instructions, SHIFT instructions, instructions to check whether the number of source bytes in the current pass is exactly three, instructions to handle CR/LF insertions, instructions to update an index, and/or branching instructions. Some embodiments include the use of particular numeric constants (denoted MagicNumbers) to speed up computation.

Fourth, some embodiments include technical adaptations such as particular lookup tables tailored for CPU endianness and/or to avoid instructions used in other approaches.

Fifth, some embodiments modify technical functionality of existing software by providing DLL (dynamically linked library) files based on technical considerations such as the amount of memory available for lookup tables that will speed Base64 encoding.

Sixth, technical advantages of some embodiments include reduced hardware and energy requirements in configurations such as server farms that were spending a significant amount of cycles on Base64 encoding, faster decoding of Base64-encoded data, and reduced processing workloads for client device processors that decode Base64-encoded data.

Seventh, some embodiments apply concrete technical means such as particular bit arrangements in lookup table entries, unrolled loops, or non-intuitively placed assembly language instructions to obtain particular technical effects such as optimized encoding and decoding functions that are directed to the specific technical problem of rapidly processing Base64 data, thereby providing a concrete and useful technical solution.

Some embodiments described herein may be viewed in a broader context. For instance, concepts such as bit shifting, concurrency, conditional execution, counting, decoding, encoding, or indexing may be relevant to a particular embodiment. However, it does not follow from the availability of a broad context that exclusive rights are being sought herein for abstract ideas; they are not. Rather, the present disclosure is focused on providing appropriately specific embodiments. Other media, systems, and methods involving applications of the various concepts are outside the present scope. Accordingly, vagueness and accompanying proof problems are also avoided under a proper understanding of the present disclosure.

Some Terminology and Definitions

Reference is made below to exemplary embodiments, and specific language will be used herein to describe the same. Definitions are given for some of the terminology used in the descriptions. However, alterations and further modifications of the features illustrated herein, and additional applications of the principles illustrated herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) having possession of this disclosure will understand that other examples may also fall within the meaning of the terms used, and within the scope of one or more claims. Terms do not necessarily have the same meaning here that they have in general usage, in the usage of a particular industry, or in a particular dictionary or set of dictionaries. The inventors assert and exercise their right to their own lexicography. Terms may be defined, either explicitly or implicitly, here in the Description and/or elsewhere in the application file. Some definitions are given in this section, while others appear elsewhere in the application. Explicit definitions are signaled by quotation, by the word "namely," by the indicator "i.e.," and/or by similar signals. Signals such as "e.g.," and "for example" indicate partial (non-exclusive) definitions.

Although some examples are given in working assembly language code, embodiments are not thereby limited to a particular processor or family of processors. One of skill will understand how to translate these examples to other processors, to other processor families, and to other computer programming languages such as C, C#, or C++, for example.

As used herein, a "computer system" may include, for example, one or more servers, motherboards, processing nodes, personal computers (portable or not), personal digital assistants, smartphones, cell or mobile phones, other mobile devices having at least a processor and a memory, telemetry system, realtime control system, logger, computerized process controller, and/or other device(s) providing one or more processors controlled at least in part by instructions. The instructions may be in the form of firmware or other software in memory and/or specialized circuitry. In particular, although it may occur that many embodiments run on workstation, server, or laptop computers, other embodiments may run on other computing devices, and any one or more such devices may be part of a given embodiment.

A "multi-threaded" computer system is a computer system which supports multiple execution threads. The term "thread" includes code capable of or subject to scheduling (and possibly to synchronization), and may also be known by another name, such as "task," "process," or "coroutine," for example. The threads may run in parallel, in sequence, or in a combination of parallel execution (e.g., multi-processing) and sequential execution (e.g., time-sliced). Multi-threaded environments have been designed in various configurations. Execution threads may run in parallel, or threads may be organized for parallel execution but actually take turns executing in sequence. Multi-threading may be implemented, for example, by running different threads on different cores in a multi-processing environment, by time-slicing different threads on a single processor core, or by some combination of time-sliced and multi-processor threading. Thread context switches may be initiated, for example, by a kernel's thread scheduler, by user-space signals, or by a combination of user-space and kernel operations. Threads may take turns operating on shared data, or each thread may operate on its own data, for example.

A "logical processor" or "processor" is a single independent hardware unit such as a thread-processing unit or a core in a simultaneous multi-threading implementation. As another example, a hyper-threaded quad-core chip running two threads per core has eight logical processors. A logical processor includes hardware. The term "logical" is used to prevent a mistaken conclusion that a given chip has at most one processor. Processors may be general purpose, or they may be tailored for specific uses such as graphics processing, signal processing, floating-point arithmetic processing, encryption, I/O processing, and so on.

A "multi-processor" computer system is a computer system which has multiple logical processors. Multi-processor environments occur in various configurations. In a given configuration, all of the processors may be functionally equal, whereas in another configuration some processors may differ from other processors by virtue of having different hardware capabilities, different software assignments, or both. Depending on the configuration, processors may be tightly coupled to each other on a single bus, or they may be loosely coupled. In some configurations the processors share a central memory, in some they each have their own local memory, and in some configurations both shared and local memories are present.

"Kernels" include operating systems, hypervisors, virtual machines, BIOS code, and similar hardware interface software.

"Code" means processor instructions, macros, data (which includes constants, variables, and data structures), comments, or any combination of instructions, macros, data, and comments. Code may be source, object, executable, interpretable, generated by a developer, generated automatically, and/or generated by a compiler, for example, and is written in one or more computer programming languages (which support high-level, low-level, and/or machine-level software development). Code is typically organized into functions, variable declarations, modules, and the like, in ways familiar to those of skill in the art. "Function," "routine," "method" (in the computer science sense), and "procedure" or "process" (again in the computer science sense, as opposed to the patent law sense) are used interchangeably herein.

"Program" is used broadly herein, to include applications, kernels, drivers, interrupt handlers, libraries, DLLs, and other code written by programmers (who are also referred to as developers).

As used herein, "include" allows additional elements (i.e., includes means comprises) unless otherwise stated. "Consists of" means consists essentially of, or consists entirely of. Thus, X consists essentially of Y when the non-Y part of X, if any, can be freely altered, removed, and/or added without altering the functionality of claimed embodiments so far as a claim in question is concerned.

"Process" is sometimes used herein as a term of the computing science arts, and in that technical sense encompasses resource users, namely, coroutines, threads, tasks, interrupt handlers, application processes, kernel processes, procedures, and object methods, for example. "Process" is also used herein as a patent law term of art, e.g., in describing a process claim as opposed to a system claim or an article of manufacture (configured storage medium) claim. Similarly, "method" is used herein at times as a technical term in the computing science arts (a kind of "routine") and also as a patent law term of art (a "process"). Those of skill will understand which meaning is intended in a particular instance, and will also understand that a given claimed process or method (in the patent law sense) may sometimes be implemented using one or more processes or methods (in the computing science sense).

"Automatically" means by use of automation (e.g., general purpose or special-purpose computing hardware configured by software for specific operations and technical effects discussed herein), as opposed to without automation. In particular, steps performed "automatically" are not performed by hand on paper or in a person's mind, although they may be initiated by a human person or guided interactively by a human person. Automatic steps are performed with a machine in order to obtain one or more technical effects that would not be realized without the technical interactions thus provided.

"Computationally" likewise means a computing device (processor plus memory, at least) is being used, and excludes obtaining a result by mere human thought or mere human action alone. For example, doing arithmetic with a paper and pencil is not doing arithmetic computationally as understood herein. Computational results are faster, broader, deeper, more accurate, more consistent, more comprehensive, and/or otherwise provide technical effects that are beyond the scope of human performance alone. "Computational steps" are steps performed computationally. Neither "automatically" nor "computationally" necessarily means "immediately". "Computationally" and "automatically" are used interchangeably herein.

"Proactively" means without a direct request from a user. Indeed, a user may not even realize that a proactive step by an embodiment was possible until a result of the step has been presented to the user. Except as otherwise stated, any computational and/or automatic step described herein may also be done proactively.

Throughout this document, use of the optional plural "(s)", "(es)", or "(ies)" means that one or more of the indicated feature is present. For example, "processor(s)" means "one or more processors" or equivalently "at least one processor".

Throughout this document, unless expressly stated otherwise any reference to a step in a process presumes that the step may be performed directly by a party of interest and/or performed indirectly by the party through intervening mechanisms and/or intervening entities, and still lie within the scope of the step. That is, direct performance of the step by the party of interest is not required unless direct performance is an expressly stated requirement. For example, a step involving action by a party of interest, such as the combinable and separable steps of accessing, adding, adjusting, aligning, calculating, calling, communicating, compiling, containing, controlling, converting, creating, customizing, defining, determining, displaying, dividing, eliminating, excluding, executing, formatting, generating, having, identifying, implementing, including, indexing, initializing, invoking, jumping, looping, making, moving, multiplying, obtaining, outputting, overwriting, partitioning, performing, popping, processing, producing, providing, pushing, reading, relying, residing, returning, scaling, selecting, shifting, specifying, storing, subtracting, testing, using, utilizing, writing (and accesses, accessed, adds, added, and so on) with regard to a destination or other subject may involve intervening actions (steps) such as authenticating, compressing, copying, decoding, decompressing, decrypting, downloading, encoding, encrypting, forwarding, invoking, moving, reading, storing, uploading, writing, and so on by some other party, yet still be understood as being performed directly by the party of interest.

An embodiment may include any means for performing a step or act recognized herein (e.g., recognized in the preceding paragraph and/or in the list of reference numerals), regardless of whether the means is expressly denoted in the specification using the word "means" or not, including for example any mechanism or algorithm described herein using a code listing, provided that the claim expressly recites the phrase "means for" in conjunction with the step or act in question. For clarity and convenience, the reference numeral for the step or act in question also serves as the reference numeral for such means when the phrase "means for" is used with that reference numeral, e.g., "searching means (640) for searching for a null that terminates a string".

Whenever reference is made to data or instructions, it is understood that these items configure a computer-readable memory and/or computer-readable storage medium, thereby transforming it to a particular article, as opposed to simply existing on paper, in a person's mind, or as a mere signal being propagated on a wire, for example. Unless expressly stated otherwise in a claim, a claim does not cover a signal per se or a propagated signal per se. A memory or other computer-readable storage medium is not a propagating signal or a carrier wave outside the scope of patentable subject matter under United States Patent and Trademark Office (USPTO) interpretation of the *In re Nuijten* case.

Moreover, notwithstanding anything apparently to the contrary elsewhere herein, a clear distinction is to be understood between (a) computer readable storage media and computer readable memory, on the one hand, and (b) transmission media, also referred to as fleeting media or signal media, on the other hand. A transmission medium is a propagating signal or a carrier wave computer readable medium. By contrast, computer readable storage media and computer readable memory are not propagating signal or carrier wave computer readable media. Unless expressly stated otherwise, "computer readable medium" means a computer readable storage medium, not a propagating signal per se.

The terms "parm" and "parameter" refer to each of one or more parameters passed to a function, on the stack or using another familiar parameter-passing mechanism. Parameters may be passed by value and/or by reference.

Programming Language Syntax Choices

Those of skill will understand the three-tiered approach taken herein. At the highest level, various concepts are discussed; they provide context but are not themselves claimed. Some examples include the concepts of encoding binary data into using a specified set of printable text characters, decoding such encoded data back into binary form, and using a lookup table for some purpose. Embodiments apply concepts and principles to specific problems in specific ways, and are suitable subject matter for claims. Examples include the claims presented, and any combination of the components and steps described in the text and/or figures as pieces of an embodiment. At the lowest level, some examples of embodiment implementations are given herein, even though this is not a legal requirement for an enabling written description of claimed innovations. Implementations help illustrate features of embodiments. However, unless a claim states otherwise, a given embodiment may be implemented in various ways, so an embodiment is not limited to any particular implementation, including any particular code listing, choice of programming language, variable name, or other implementation choice.

Assembly-language examples herein use the FASM (Flat Assembler) assembly-language syntax used by the popular Flat Assembler product, which is freely available at www dot flatassembler dot net (web addresses herein are for convenience only; they are not meant to incorporate information and not meant to act as live hyperlinks). FASM syntax differs somewhat from the MASM (Microsoft Macro Assembler) syntax that some skilled in the art also use. However, one of skill will understand either syntax.

For example, the FASM instruction "mov eax, triplets" will move the memory address of the "triplets" variable into the eax register, whereas the FASM instruction "mov eax, [triplets]" will move the value stored in the "triplets" variable, or the contents located at that memory address, into the eax register. In FASM, using brackets means code is to access the value located at that location in memory, whereas no brackets around a memory location or variable name means code is to access the address of that location or variable. This is different from MASM syntax, where the above examples would both operate the same and would both access the value in memory, and not the address, whether brackets are used or not. One of skill in the art of assembly language would know that certain registers should be appropriately preserved prior to their first use and then restored when no longer needed. This is implementation specific; Intel recommends that the registers ebx, esi, edi, and ebp should be preserved across function calls. Operating systems and various programming environments could modify these rules in some cases or for certain function calls; therefore, a skilled person would be aware of the appropriate registers to preserve. Additionally, such a skilled person would ensure that registers are properly initialized to prevent unintended effects of certain CPU commands that modify more than one register (such as the MUL command which can modify both edx and eax), or which use implicit values from one or more other non-specified registers (such as the DIV command, which relies on the value in both edx and eax) or flag values (such as SBB and ADC), in addition to other effects based on previous and/or succeeding code paths.

Additionally, when assembly language is used or assumed in use, the following terms may be used to describe the size of a variable or memory location; note that other than the 8-bit byte, these terms are often used in ways that are specific to the Intel (and compatible) family of CPUs: byte or char (8 bits), word (16 bits), double word or dword (32 bits), quad word or qword (64 bits), and double quad word or dqword (128 bits). A word has two bytes (a lower and an upper); a dword has two words (a lower and an upper); and a qword has two dwords (a lower and an upper); and so forth. The lower portion is the lower half of the bits of the variable or memory location, whereas the higher portion is the upper half. Additionally, the term "natural-word-size" indicates the bit size of the current execution environment (usually 32 or 64 bits). Sometimes the term "word" is used generically where the size could be one of several of the above sizes, in which case the context will make clear which size is intended. Sometimes the term "char" is used to refer to either a one-byte character or a two-byte character; the context will make it clear which type is referred to, or in some cases, it can refer to both types.

Although Intel® CPU architectures (mark of Intel Corporation) are used in many examples, a person skilled in the art will recognize that teachings herein also apply to some other processor architectures. CPU stands for Central Processing Unit, an older term for processor or microprocessor. For other CPU architectures, a word can be 32 bytes instead of 16; additionally, on big-endian CPUs, the lower and higher portions of multi-byte words stored in memory are reversed.

The Intel CPU platform includes intrinsic operations that can perform mathematical and logical instructions on integers (whole numbers) of various sizes: 8-bit (byte), 16-bit (short or word), 32-bit (int or dword), 64-bit (long or qword or long long or also, confusingly, int). Each integer can be either signed or unsigned. Other sizes can be created by adding bytes to any native size, although custom coding may be called on to handle those formats. Intel may well add native processor support for 128-bit numbers; there is already some Intel® processor support for handling 128-bit, 256-bit, and/or 512-bit data objects.

An Intel® FPU (Floating Point Unit, a.k.a. math coprocessor or numeric coprocessor) includes native support for three types of signed floating-point (real) numbers: 32-bit (float), 64-bit (double), 80-bit (extended precision). The Intel CPU also provides additional register/coprocessor floating-point technology that makes other registers and instructions available to those of skill when implementing the teachings in the present disclosure, such as an MMX instruction set, streaming SIMD (single instruction multiple data) extensions SSE, SSE2, SSE3, SSSE3, SSE4, an AVX instruction set extension, and others.

Since the CPU's general-purpose registers deal natively with integer types only, other coprocessors (such as the FPU) and registers (such as MMX and XMM registers) include basic support for transferring real numbers and integers to/from memory, for manipulating floating-point numbers, and for converting between integers and floating-point numbers.

As is known in the art, familiar 32-bit Intel® CPUs have eight general-purpose registers: eax, ebx, ecx, edx, esi, edi, ebp, and esp ("Intel" is a mark of Intel Corporation). The eax, ecx, and edx registers are generally available for use immediately when a function receives control, while the ebx, esi, edi, ebp, and esp registers should be preserved and used carefully so as not to corrupt the program flow. The eflags register contains flags (such as 'zero', 'overflow', and 'carry'), and the eip instruction pointer points to the current instruction. The 64-bit Intel® CPU architecture expands those general-purpose registers to 64 bits (rax, rbx, rcx, rdx, rsi, rdi, rbp, and rsp, plus rflags and rip), while still retaining the ability to access the low 32 bits (or fewer) of those registers using 32-bit mnemonics, and adds eight additional registers (r8, r9, r10, r11, r12, r13, r14, and r15). While most examples herein are described for Intel and Intel-compatible CPU environments and architectures, the concepts apply to other CPU environments and architectures as well, and the claims, unless specifically stated otherwise, include non-Intel CPU environments and/or architectures as well.

Some Additional Terminology

One term used herein is "ASCII" but it will be understood that encodings into character sets other than ASCII can also be used with teachings herein, such as Unicode and the ISO/IEC 10646 Universal Character Set (UCS). An ASCII format that uses one byte per display character (or eight bits) is sometimes referred to herein as "Unicode8" or "ASCII", while an ASCII format that uses two bytes per display character (or sixteen bits) may be referred to as "Unicode16."

Note that Unicode16 takes twice as many bytes in an output buffer (and in some innovative tables described herein) as compared to Unicode8. Other than this, one of skill may find no significant issues that impact porting an algorithm between Unicode8 and Unicode16. Some examples herein assume the use of Unicode8, but many methods and structures taught herein can be readily adapted to Unicode16 by a person skilled in the art of computer programming.

LIST OF REFERENCE NUMERALS

The following list is provided for convenience and in support of the drawing figures and the text of the specification and text, which describe a large number of innovations by reference to multiple items. Items not listed here may nonetheless be part of a given embodiment. For better legibility of the text, a given reference number is recited near some, but not all, recitations of the referenced item in the text. Those of skill will understand that omission of a reference numeral at a particular recitation therefore does not mean some other item is being recited. The list is: 100 operating environment; 102 computer system; 104 user; 106 peripheral; 108 user interface; 110 network; 112 processor (a.k.a. CPU, without limitation to general-purpose processing; "a.k.a." means "also known as"); 114 computer-readable storage medium, e.g., memory; 116 instructions (a.k.a. code, software); 118 data; 120 hardware circuitry (includes embedded microcode, infrastructure such as printed circuit board); 122 display; 124 Integrated Development Environment (IDE); 126 compiler; 128 document, e.g., paper document, software interface and/or other electronic document; 130 library, e.g., .DLL file, .O file, other collection of software routines reusable in various applications; 132 program; 134 code, e.g., source code, object code, library code, executable code, static or dynamic table; 136 software, a.k.a. software logic; 202 encoder; 204 innovative encoding lookup table; 205 innovative decoding lookup table; 206 encoding lookup table quadrant; 208 familiar Base64 64-byte conversion table; 210 little-endian CPU; 212 big-endian CPU; 214 data source (data to be encoded/decoded); 215 encoding's supplemental elements; 216 index; 218 output buffer; 219 output buffer size; 220 upper bit(s); 221 decoded data; 222 encoded data; 223 length of encoded data; 224 group of source bytes; 226 equal sign; 228 decoder; 230 total count; 232 padding; 234 processing time; 236 end of the source; 238 jump table; 240 branch; 242 size of group of source bytes; 243 parameter; 244 encoding function; 246 decoding function; 247 length of decoded data; 248 carriage return and line feed (CR/LF) pair; 250 equate; 252 blocksize; 254 register; 256 position in output buffer; 258 ending process; 260 register dependency; 262 address; 264 code section; 266 data section; 268 assembly language; 269 assembler; 270 implementation; 272 null byte; 274 caller; 276 stack frame; 277 stack; 278 loop; 280 bit; 282 byte; 284 six-bit element/character; 286 input buffer; 288 word; 290 counter; 292 derived lookup table; 294 table entry; 296 process/thread/task etc.; 298 MagicNumber used to perform division by multiplying; 400 flow chart; 401 assemble, compile, or interpret source code; 402 reverse bytes; 404 read byte(s); 406 shift bit(s); 408 treat data as separate six-bit elements; 410 use as an index; 411 use as a negative offset; 412 append; 414 accompany index; 416 mask bit(s); 417 isolate bit(s); 418 clear bit(s); 420 expand table; 422 access quadrant of table; 424 perform encoding; 426 perform decoding; 428 obtain an encoding; 430 perform special handling; 432 indicate; 434 ignore or avoid; 435 skip part of source; 436 check whether a value is a multiple of three; 438 save; 440 process source bytes as though no characters are missing; 442 follow branch; 444 perform ending process; 446 adjust for missing one or two bytes at end; 448 perform fast loop indexing; 450 insert; 452 eliminate logic; 454 mark; 456 acquire index for grouping; 458 process a grouping; 460 write to output buffer; 462 make room in register; 463 overload a register or variable; 464 exit; 466 create table; 468 restore register; 470 return control; 472 re-read source byte; 474 combine into register; 476 unroll loop; 480 point to; 482 AND values; 484 OR values; 486 determine number of loop iterations; 488 divide by multiplying with MagicNumber; 490 push registers; 491 pop registers; 492 place assembly language instruction manually, at a different location than would be chosen automatically by a compiler code generator.

Some Operating Environments

An operating environment 100 for an embodiment may include a computer system 102. The computer system 102 may be a multi-processor computer system, or not. An operating environment 100 may include one or more computing machines in a given computer system, which may be clustered, client-server networked, and/or peer-to-peer networked. An individual machine is a computer system 102, and a group of cooperating machines is also a computer system 102. A given computer system may be configured for end-users, e.g., with applications, for administrators, as a server, as a distributed processing node, and/or in other ways.

Human users 104 may interact with the computer system 102 by using displays, keyboards, microphones, mice, and other peripherals 106, via typed text, touch, voice, movement, computer vision, gestures, and/or other forms of I/O. A user interface 108 may support interaction between an embodiment and one or more human users 104. A user interface 108 may include a command line interface, a graphical user interface (GUI), natural user interface (NUI), voice command interface, and/or other interface presentations. A user interface 108 may be generated on a local desktop computer, or on a smart phone, for example, or it may be generated from a web server and sent to a client. The user interface 108 may be generated as part of a service and it may be integrated with other services, such as social networking services. A given operating environment 100 includes devices and infrastructure which support these different user interface generation options and uses.

One kind of user interface 108 is a natural user interface (NUI). NUI operation may use speech recognition, touch and stylus recognition, gesture recognition both on screen and adjacent to the screen, air gestures, head and eye tracking, voice and speech, vision, touch, gestures, and/or machine intelligence, for example. Some examples of NUI technologies include peripherals 106 such as touch-sensitive displays, voice and speech recognition subsystems, intention and goal understanding subsystems, motion gesture detection using depth cameras (such as stereoscopic camera systems, infrared camera systems, RGB camera systems and combinations of these), motion gesture detection using accelerometers/gyroscopes, facial recognition, 3D displays, head, eye, and gaze tracking subsystems, immersive augmented reality and virtual reality subsystems, all of which provide a more natural interface 108, as well as subsystem technologies for sensing brain activity using electric field sensing electrodes (electroencephalograph and related tools).

One of skill will appreciate that the foregoing peripherals, devices, and other aspects presented herein as part of operating environments 100 may also form part of a given embodiment. More generally, this document's headings are not intended to provide a strict classification of features into embodiment and non-embodiment feature classes.

As another example, a game may be resident on a Microsoft XBOX Live® server (mark of Microsoft Corporation) or other game server. The game may be purchased from a console and it may be executed in whole or in part on the server, on the console, or both. Multiple users 104 may interact with the game using peripherals 106 such as standard controllers, or with air gestures, voice, or using a companion device such as a smartphone or a tablet. A given operating environment 100 includes devices and infrastructure which support these different use scenarios.

System administrators, developers, engineers, and end-users are each a particular type of user 104. Automated agents, scripts, playback software, and the like acting on behalf of one or more people may also be users. Storage devices and/or networking devices may be considered peripheral equipment in some embodiments. Other computer systems may interact in technological ways with the computer system in question or with another system embodiment using one or more connections to a network 110 via network interface equipment, for example.

The computer system 102 includes at least one logical processor 112 (a.k.a. processor 112) for executing programs 132, compilers 126, and other software 136. Compilers 126 are merely one example of software 136 that might be present; a given embodiment does not necessarily include a compiler. The computer system, like other suitable systems, also includes one or more computer-readable storage media 114. Media 114 may be of different physical types. The media 114 may be volatile memory, non-volatile memory, fixed in place media, removable media, magnetic media, optical media, and/or of other types of physical durable storage media (as opposed to merely a propagated signal). In particular, a configured medium 114 such as a CD, DVD, memory stick, or other removable non-volatile memory medium may become functionally a technological part of the computer system 102 when inserted or otherwise installed, making its content accessible for interaction with and use by a processor 112. The removable configured medium is an example of a computer-readable storage medium 114. Some other examples of computer-readable storage media 114 include built-in RAM, EEPROMS or other ROMs, disks (magnetic, optical, solid-state, internal, and/or external), and other memory storage devices, including those which are not readily removable by users. Neither a computer-readable medium nor its exemplar a computer-readable memory includes a signal per se.

A general-purpose memory 114, which may be removable or not, and may be volatile or not, can be configured into an embodiment using items such as particular tables 204, 205 and corresponding encoding and/or decoding functions 244, 246, in the form of data and instructions, read from a removable medium and/or another source such as a network connection, to form a configured storage medium 114. The configured storage medium 114 is capable of causing a computer system 102 to perform technical process steps for data formatting and other operations as disclosed herein. Discussion of configured storage-media embodiments also illuminates process embodiments, as well as system embodiments. In particular, any of the process steps taught herein may be used to help configure a storage medium to form a configured medium embodiment.

The medium 114 is configured with instructions 116 that are executable by a processor 112; "executable" is used in a broad sense herein to include machine code, interpretable code, bytecode, and/or code that runs on a virtual machine, for example. The medium 114 is also configured with data 118 which is created, modified, referenced, and/or otherwise used for technical effect by execution of the instructions 116. The instructions and the data configure the memory or other storage medium 114 in which they reside; when that memory or other computer readable storage medium is a functional part of a given computer system 102, the instructions and data also configure that computer system. In some embodiments, a portion of the data 118 is representative of real-world items such as product characteristics, inventories, physical measurements, settings, images, readings, targets, volumes, and so forth. Data 118 is also transformed by backup, restore, commits, aborts, reformatting, and/or other technical operations. Data 118 may be stored or transmitted in such as documents 128 for subsequent use.

Although an embodiment may be described as being implemented as software instructions 116 executed by one or more processors 112 in a computing device 102 (e.g., in a general purpose computer, server, cell phone, tablet, or gaming console), such description is not meant to exhaust all possible embodiments. One of skill will understand that the same or similar functionality can also often be implemented, in whole or in part, directly in hardware circuitry 120, to provide the same or similar technical effects. Alternatively, or in addition to software implementation, the technical functionality described herein can be performed, at least in part, by one or more hardware logic components 120. For example, and without excluding other implementations, an embodiment may include hardware logic 120 components such as Field-Programmable Gate Arrays (FPGAs), Application-Specific Integrated Circuits (ASICs), Application-Specific Standard Products (ASSPs), System-on-a-Chip components (SOCs), Complex Programmable Logic Devices (CPLDs), and similar components. Components of an embodiment may be grouped into interacting functional modules based on their inputs, outputs, and/or their technical effects, for example.

In some environments, one or more applications have code instructions 116 such as user interface code 108, executable and/or interpretable code files, and metadata. Software development tools such as compilers and source-code generators assist with software development by producing and/or transforming code, e.g., by compilation of source code into object code or executable code. The code, tools, and other items may each reside partially or entirely within one or more hardware media 114, thereby configuring those media for technical effects which go beyond the "normal" (i.e., least common denominator) interactions inherent in all hardware—software cooperative operation. In addition to processors 112 (CPUs, ALUs, FPUs, and/or GPUs), memory/storage media 114, display(s) 122, other peripherals 106 such as pointing/mouse/touch input devices, and keyboards, an operating environment 100 may also include other hardware, such as battery(ies), buses, power supplies, wired and wireless network interface cards, and accelerators, for instance. As to processors 112, CPUs are central processing units, ALUs are arithmetic and logic units, FPUs are floating-point processing units, and GPUs are graphical processing units.

A given operating environment 100 may include an Integrated Development Environment (IDE) 124 which provides a developer with a set of coordinated software development tools such as compilers, source-code editors, profilers, debuggers, libraries for common operations such as I/O and formatting, and so on. In particular, some of the suitable operating environments for some embodiments include or help create a Microsoft® Visual Studio® development environment (marks of Microsoft Corporation) configured to support program development. Some suitable operating environments include MASM (Microsoft Macro Assembler) or FASM (Flat Assembler). Some suitable operating environments include Java® environments (mark of Oracle America, Inc.), and some include environments which utilize languages such as C, Objective C, C++, C# ("C-Sharp"), or Python, but teachings herein are applicable with a wide variety of programming languages, programming models, and programs 132, as well as with endeavors outside the field of software development per se.

In some embodiments peripherals 106 such as human user I/O devices (screen, keyboard, mouse, tablet, microphone, speaker, motion sensor, etc.) will be present in operable communication with one or more processors 112 and memory 114. However, an embodiment may also be deeply embedded in a technical system 102, such that no human user 104 interacts directly with the embodiment. Software processes may be users.

In some embodiments, the system 102 includes multiple computers connected by a network 110. Networking interface equipment can provide access to networks, using system 102 components such as a packet-switched network interface card, a wireless transceiver, or a telephone network interface, one or more of which may be present in a given computer system. However, an embodiment may also communicate technical data and/or technical instructions through direct memory access, removable nonvolatile media, or other information storage-retrieval and/or transmission approaches, or an embodiment in a given computer system 102 may operate without communicating with other computer systems.

Some embodiments operate in a "cloud" computing environment and/or a "cloud" storage environment in which computing services are not owned but are provided on demand.

For example, internal computational data 118 may be generated and/or stored on multiple devices/systems in a networked cloud of systems 102, may be transferred to other devices within the cloud where it is converted into a human-readable or other format for display or printing, and then be sent to the displays 122 or printers on yet other cloud device(s)/system(s).

Additional details and design considerations are provided below. As with the other examples herein, the features described may be used individually and/or in combination, or not at all, in a given embodiment.

Those of skill will understand that implementation details may pertain to specific code, such as specific APIs and specific sample programs, and thus need not appear in every embodiment. Those of skill will also understand that program identifiers and some other terminology used here in discussing details are implementation-specific and thus need not pertain to every embodiment. Nonetheless, although they are not necessarily required to be present here, these details are provided because they may help some readers by providing context and/or may illustrate a few of the many possible implementations of the technology discussed herein.

Some Uses for Base64

The original SMTP email protocol was used to transmit text via modems. Embedded in the text were various control commands specified by certain characters of the ASCII character set. Normal text uses letters (upper and lower case), numbers, spaces, and certain punctuation and other characters, and these characters were handled similarly by virtually all implementations. But use of so-called "non-text" control characters embedded in email texts were sometimes handled differently by various SMTP implementations and sometimes resulted in corrupt data transmissions. Including binary files in a message was therefore problematic (note that a binary file could contain one or more instances of each of the 256 possible ASCII codes). Therefore, various methods were developed to convert binary text into a sequence of "safe" characters which could be transferred without problem, where each character after encoding uses fewer than eight bits per encoded character.

As used herein, a "CR/LF pair" is a CR followed immediately by a LF.

The shortened form "char" is sometimes used instead of "character."

"Safe" characters are those which will not be confused with control characters when decoded; they include for instance various subsets of the ASCII characters in the decimal range 0 through 127. The safest characters are letters and digits: upper-case letters 'A' through 'Z' (ASCII decimal values 65 through 90); lower-case letters 'a' through 'z' (ASCII decimal values 97 through 122); and digits '0' through '9' (ASCII decimal values 48 through 57). By convention, other characters can be included in the list of safe characters, such as minus '−' (value 45), plus '+' (value 43), forward slash '/' (value 47), period '.' (value 46), tilde '~' (value 126), underscore '_' (value 95), and equals 226 '=' (value 61).

Various safe formats have been created and utilized for the purpose of transmitting data unambiguously via modems. A hexadecimal format can be safely used, as all hexadecimal characters are comprised solely of the digits 0 through 9, and/or the letters 'A' through 'F' (or 'a' through 'f'). Each of the 22 possible character bytes ('0' . . . '9', 'A' . . . 'F', 'a' . . . 'f') is in the safe range for being transmitted without being confused as a control byte; some conventions use a 16-character hexadecimal encoding alphabet utilizing digits and upper-case-only characters ('0' . . . '9' and 'A' . . . 'F').

Converting to hexadecimal format doubles the size of the data, however, since every original byte corresponds to two bytes once converted to the four-bit hexadecimal format (which leaves four unused bits in each byte which are always cleared to 0). For example, a 24-byte binary file would have 48 bytes in its hexadecimal representation, which is an expansion of 2:1 for the file.

Using a power-of-two encoding base simplifies processing in digital computers. Using more bits for the conversion can reduce the encoding size. Using a base-16 (hexadecimal) representation simplifies programming logic: since each base-16 number has four bits and there are eight bits in a byte, any byte can be exactly represented by two hexadecimal digits. Sometimes a base-32 representation is used; in this format, each base-32 number has five bits, which means that every five original bytes (40 bits) would be converted into eight encoded bytes, each using five bits, which would expand the original file 8:5. A base-64 encoding, which uses six bits for each output character, can be used to convert three bytes (24 bits) into four six-bit characters, resulting in a 4:3 expansion of the file, which has been determined to be acceptable for many situations. RFC 4648 from the Network Working Group is a technical document describing some Base64 encoding standards.

Various Base64 implementations are known in the art. The RFC 4648 document describes encoding which processes three source bytes as a group (exactly 24 bits of data) and generates exactly four bytes of output for that group, with each output byte representing the base-64 encoding of six bits of data. An encoding method outlined in RFC 4648 describes the rules to which any compliant Base64 encoding method adheres.

In some implementations, a maximum line length is enforced. For example, MIME enforces a limit of 76 characters, and Privacy Enhanced Mail (PEM) enforces a limit of 64 characters. The limit requires a line feed (which is usually a CR/LF combination as is known in the art) to be inserted after each 76 characters to denote a new line. Due to various implementations that would not otherwise be strictly compatible, RFC 4648 allows for characters outside the base-encoding alphabet to be ignored during decoding ("be liberal in what you accept" according to one suggestion in the RFC).

In one familiar Base64 implementation, the following encoding alphabet is used

TABLE 1

| Value | Encoded |
|---|---|
| 0 | 'A' |
| 1 | 'B' |
| 2 | 'C' |
| 3 | 'D' |
| 4 | 'E' |
| 5 | 'F' |
| 6 | 'G' |
| 7 | 'H' |
| 8 | 'I' |
| 9 | 'J' |
| 10 | 'K' |
| 11 | 'L' |
| 12 | 'M' |
| 13 | 'N' |
| 14 | 'O' |
| 15 | 'P' |
| 16 | 'Q' |
| 17 | 'R' |
| 18 | 'S' |
| 19 | 'T' |
| 20 | 'U' |
| 21 | 'V' |

TABLE 1-continued

| Value | Encoded |
|---|---|
| 22 | 'W' |
| 23 | 'X' |
| 24 | 'Y' |
| 25 | 'Z' |
| 26 | 'a' |
| 27 | 'b' |
| 28 | 'c' |
| 29 | 'd' |
| 30 | 'e' |
| 31 | 'f' |
| 32 | 'g' |
| 33 | 'h' |
| 34 | 'i' |
| 35 | 'j' |
| 36 | 'k' |
| 37 | 'l' |
| 38 | 'm' |
| 39 | 'n' |
| 40 | 'o' |
| 41 | 'p' |
| 42 | 'q' |
| 43 | 'r' |
| 44 | 's' |
| 45 | 't' |
| 46 | 'u' |
| 47 | 'v' |
| 48 | 'w' |
| 49 | 'x' |
| 50 | 'y' |
| 51 | 'z' |
| 52 | '0' |
| 53 | '1' |
| 54 | '2' |
| 55 | '3' |
| 56 | '4' |
| 57 | '5' |
| 58 | '6' |
| 59 | '7' |
| 60 | '8' |
| 61 | '9' |
| 62 | '+' |
| 63 | '/' |
| (pad) | '=' |

Since in some legacy text-search/index tools the characters plus '+' and forward slash '/' are treated as word-break symbols, it has been suggested that these be replaced with minus '−' and underscore '_' characters. Such a table can be used for encoding with a URL- and filename-safe alphabet. The following Base64_URL table can therefore also be used for Base64 encoding; note that the only difference between Table 2 below and Table 1 above is the encoding for values 62 and 63

TABLE 2

| Value | Encoded |
|---|---|
| 0 | 'A' |
| 1 | 'B' |
| 2 | 'C' |
| 3 | 'D' |
| 4 | 'E' |
| 5 | 'F' |
| 6 | 'G' |
| 7 | 'H' |
| 8 | 'I' |
| 9 | 'J' |
| 10 | 'K' |
| 11 | 'L' |
| 12 | 'M' |
| 13 | 'N' |
| 14 | 'O' |
| 15 | 'P' |

TABLE 2-continued

| Value | Encoded |
|---|---|
| 16 | 'Q' |
| 17 | 'R' |
| 18 | 'S' |
| 19 | 'T' |
| 20 | 'U' |
| 21 | 'V' |
| 22 | 'W' |
| 23 | 'X' |
| 24 | 'Y' |
| 25 | 'Z' |
| 26 | 'a' |
| 27 | 'b' |
| 28 | 'c' |
| 29 | 'd' |
| 30 | 'e' |
| 31 | 'f' |
| 32 | 'g' |
| 33 | 'h' |
| 34 | 'i' |
| 35 | 'j' |
| 36 | 'k' |
| 37 | 'l' |
| 38 | 'm' |
| 39 | 'n' |
| 40 | 'o' |
| 41 | 'p' |
| 42 | 'q' |
| 43 | 'r' |
| 44 | 's' |
| 45 | 't' |
| 46 | 'u' |
| 47 | 'v' |
| 48 | 'w' |
| 49 | 'x' |
| 50 | 'y' |
| 51 | 'z' |
| 52 | '0' |
| 53 | '1' |
| 54 | '2' |
| 55 | '3' |
| 56 | '4' |
| 57 | '5' |
| 58 | '6' |
| 59 | '7' |
| 60 | '8' |
| 61 | '9' |
| 62 | '-' |
| 63 | '_' |
| (pad) | '=' |

Other characters have also been suggested as replacements for the last two encoding characters, such as the period and tilde characters. Various implementations have been described (see, e.g., the Wikipedia article "Base64"). The equals sign is a special flag used to denote the end of the source stream and is used to pad the last group of encoded output bytes so that it is exactly four bytes in length.

Most known implementations exactly follow the encoding method described in the RFC 4648 document: processing three 8-bit bytes which are grouped and then treated as a group of four 6-bit characters, each of which is translated into a single character in the Base64 alphabet, with special handling of the last bytes of the original input stream; each of the four characters is stored in an eight-bit byte. However, other methods have been devised that are more efficient yet still produce the same output. Some familiar methods process each group of three 8-bit inputs (24 bits) as two 12-bit numbers, rather than as four G-bit numbers, thereby increasing execution speed of the algorithm. One such method was written in C/C++, another in assembly language; both used 8 k of table information. Another method uses two 128 k tables accessed by two 16-bit indexes to encode the source data.

Each of these methods access the source data one byte at a time. And each of these methods can be improved.

The encoding and decoding methods described in the present disclosure are designed to handle single-byte (Unicode8) characters, but one skilled in the art will recognize that they can also accommodate double-byte (Unicode16) characters with no changes required. Base64 encoding will encode single-byte data streams (sometimes referred to as binary data), which gives two options for encoding Unicode16 characters streams: the stream can be first converted into UTF-8 single-byte-oriented format and then encoded, or it can be treated as though it were a normal byte-oriented stream and encoded directly without requiring conversion to another format. With these options, there are no changes needed to be made to the encoding or decoding algorithms described in the present disclosure; they can immediately handle any byte sequence of any data stream. When decoding Unicode16 characters, again, no change is required in the decoding algorithms below; the decoding algorithms return a pointer to a byte-oriented output buffer which can then be interpreted as a stream of bytes or as a stream of double-byte characters, whichever is deemed most appropriate by the implementer skilled in the art of programming.

Six innovative Base64 encoding method versions will now be described. The first five versions produce identical output and use a familiar Base64 encoding alphabet, inserting CR/LF pairs after every 76 output characters; the sixth version does not insert CR/LF pairs but the output available is otherwise the same. One of skill could slightly modify these method teachings to accommodate different versions of the encoding alphabet (Base64, or Base64_URL, or others), or to create versions that do not insert carriage return/line feeds in the output stream; all such conversions are considered part of the present disclosure. Note that the last method, denoted below as Encode64-F, does not insert CR/LF pairs into the data stream and is also an unrolled version of Encode64-E, thereby showing one way of modifying the algorithms to not insert CR/LF pairs and also showing one way of unrolling the loops. Note that each encoding method below has been tested by inventor Eric Ruff and correctly encodes the sample data listed in the RFC 4648 document.

By way of introduction, the first encoding method version detailed below, which is called Encode64-A, processes data 6 bits at a time and uses only one 256-byte lookup table. Encode64-B also processes data 6 bits at a time, but adds two additional 1 k tables for faster processing (it uses 2,304 bytes of table-lookup data and is around 20 percent faster than Encode64-A). Both these methods A and B can improve encoding performance on CPUs where the L1 cache is very small, in that using larger tables could cause other portions of code instructions or data to fall out of the cache, thus potentially slowing the encoding process and/or other processes. Encode64-C processes 12 bits at a time and uses 24 k of table data; it is about 67 percent faster than Encode64-A. Encode64-D processes 24 bits at a time and uses 64 MB of table space, and is similar in speed to method C. Encode64-E processes the first 6 bits of source using a 256-byte lookup table, then the following 18 bits of source bytes using 1 MB of table lookup data; it is about twice as fast as Encode64-A. Encode64-F is an unrolled version of Encode64E that does not insert CR/LF pairs; it is 120 percent faster than Encode64-A, processes 24 source bytes per loop, and uses one of the prior methods to handle the last 23 bytes (or fewer) of source data.

A Hewlett-Packard HDX16 Notebook PC (marks of Hewlett-Packard Development Company, L.P.) with a 2.66 Ghz Intel® Core™ 2 Duo processor, (marks of Intel Corporation) and 32-bit code running on 64-bit Vista® Home Premium operating system (mark of Microsoft Corporation), were used for the speed comparisons noted here; one thread on one core was used to produce the timings shown below. One of skill would note that these algorithms can be parallelized on multiple cores for substantial speed improvements beyond what's shown in this table

| Algorithm | Size Tables | Speed | Relative to 'A' |
|---|---|---|---|
| Encode64-A | 256 bytes | 631 MB/sec | 1.00 x |
| Encode64-B | 2.3K bytes | 775 MB/sec | 1.23 x |
| Encode64-C | 24K bytes | 1,050 MB/sec | 1.67 x |
| Encode64-D | 64 MB | 1,063 MB/sec | 1.69 x |
| Encode64-E | 1 MB | 1,287 MB/sec | 2.04 x |
| Encode64-F | 1 MB | 1,404 MB/sec | 2.23 x |

All source code herein is Copyright NumberGun, LLC, all rights reserved. FASM syntax is used for the assembly-language examples below. Although the examples herein were written to run in 32-bit environment of the Intel family of CPUs, the methods described in the present disclosure can be implemented on other 32-bit and/or 64-bit CPUs, and such versions are contemplated herein.

Encode64-A

This encoder 202 method uses a 256-byte encoding lookup table 204 that contains four consecutive copies (each copy in a quadrant 206) of a familiar Base64 64-byte conversion table 208. A FASM command such as the one below can create 466 this table:

```
Tbl.Encode64.First:
    rept 4 {
        db 'ABCDEFGHIJKLMNOPQRSTUVWXYZ'
        db 'abcdefghijklmnopqrstuvwxyz0123456789+/'
    }
```

Intel-compatible CPUs 112 access memory 114 in the little-endian format, which affects data access when more than one byte 282 is accessed at a time and which also impacts register 254 usage. Since the Base64 encoding method described in the familiar approach assumes the source 214 bytes are processed consecutively, and since algorithms discussed below access 404 the data multiple bytes at a time, the bytes are reversed 402 on little-endian CPUs 210, 112 after each multiple-byte access of the source 24 bytes; this reversal is not needed on big-endian CPUs 212, 112. One quick way to do this reversal 402 is via the BSWAP instruction (available on Intel-compatible CPUs starting with the Intel486™ processor family (marks of Intel Corporation)), but one of skill implementing these algorithms could use other methods to obtain the same result (on certain CPUs, for example, the BSWAP command may not exist or it may consume multiple clocks thereby slowing processing). Some methods avoid the BSWAP instruction due to manipulating the bits of each source byte more extensively in order to handle the mismatch caused by the transition between the big-endian format in memory and the little-endian format in the CPU registers, which takes more execution time 234, thereby slowing down those methods. (Some newer Intel CPUs include the MOVBE command that combines the BSWAP and MOV commands into one instruction, thereby eliminating the need for a separate BSWAP command. Note that the purpose of BSWAP is to convert big-endian data into little-endian format, or vice versa.)

In a core function 244 of a main loop 278 of this method A, four bytes are read 404 from the source 214 in one 32-bit access, and the bytes are immediately reversed 402 as described above to be in the proper order (big-endian format) for processing. The fourth source byte is not needed at this time, so it is shifted 406 out, leaving 24 bits to process. In one algorithm these 24 bits are treated 408 as four separate six-bit elements 284; each of these six-bit elements will be used 410 as an index 216 into a subset of the Tbl.Encode64.First table 204 to obtain 428 the encoding 222 for that portion of the source 214 which is then effectively appended 412 to an output buffer 218.

In the algorithm presented next, however, each six-bit index is accompanied 414 by two higher upper bits 220 whose values will vary (an eight-bit byte is actually used 410 as an index without masking 416 off the two unneeded upper bits). Although the upper two bits are not needed and in some approaches would otherwise be cleared 418 to zero before accessing the encoding lookup table, the table has been expanded 420 into a four-quadrant table 204 that can handle any sequence for those upper two bits. The bit pattern of the two upper bits simply determines which quadrant 206 of the encoding table is accessed 422; and since each quadrant of the encoding table has identical content, the exact same encoding 222 will be obtained whether those bits are cleared or not. So according to the present approach A, no processing time 234 need be spent to clear those upper bits, resulting in a faster algorithm.

According to the RFC 4648 specification, special handling 430 is required for the last group 224 of source bytes 214 to be encoded, and there are three possibilities: that last group will be exactly one, two, or three bytes. If the total number of source bytes is an exact multiple of three, that last 24-bit group 224 will contain exactly three source bytes and the resulting output will be correct. If it is one or two (i.e., there are two or one "missing" source bytes), special handling is required to avoid incorrect encoding, which handling 430 includes adding 450 one or two equal signs 226 to indicate 432 to a decoder 228 that the total count 230 is one or two less than a multiple of three. To ensure exact encoding 424, the specification requires that bits of 0 be used for padding 232 of the last group when it is not a full 24-bit group; in other words, bytes of 0x00 should be used to substitute for the "missing bytes" that do not exist in the source.

To avoid the overhead inside the main loop 278 of determining whether this is the last pass and whether the number of source bytes in the current pass is exactly three, and to branch if not, some present embodiments utilize the unique and unconventional approach of ignoring 434 (e.g., avoiding, not performing) any such checking 436, to save processing time. Instead, such an embodiment processes all the source bytes as though 440 no characters are missing (possibly reading one or more bytes beyond the end 236 of the actual source 214), which could cause the last group to encode incorrectly when the total count is not an exact multiple of three. Then, a jump table 238 is used to branch 442 to and then perform 444 the appropriate ending process 258 depending on the size 242 of the last group 224 to correct 446 any such encoding error. If the last group was full, no adjustment 446 is necessary; if not, the encoding for the last group is adjusted 446. Such embodiments assume the output buffer 218 is large enough to contain the encoding 222, and that it is safe to access up to three bytes beyond the end 236 of the source 214. This safety may be achieved by using a sufficiently large input buffer 286 that the access does not cause a memory-access error; note that if 64-bit reads are used, up to seven bytes beyond the end 236 of the source 214 could be accessed 404.

One example implementation includes a function 244 named Encode64Chunks; see Code Example 1 at the end of the present specification above the claims. This implementation uses fast loop indexing 448 that involves minimal adjustment 446 at the bottom of the loop. It also inserts 450 a carriage return and line feed (CR/LF) 248 into the output buffer 218 after every 76 output bytes. Note that this algorithm can be made slightly faster by eliminating 452, 434 the logic that inserts the CR/LF pairs; one way to implement this is to change the ENCODE64_BLOCKSIZE equate 250 to a huge number greater than the maximum size expected (which in tests improves execution speed three to four percent), although one of skill could also eliminate the code related to the CR/LF insertions. Several equates 250 at the top of the code example are used to mark 454 the fact that the source is grouped 224 three bytes at a time to produce four bytes of output. The blocksize 252 is a multiple of four, which accommodates the usual blocksize constraints mentioned above (64 or 76).

In the Code Example 1 core inner-loop process (the lines between the .MainLoop and .EndofcoreProcess labels), 32 bits of data 214 are obtained 404 and converted 402 to big-endian format. The next two lines acquire 456 the index 216 for the $4^{th}$ 6-bit grouping 224; note that these lines could be replaced by a single 'movzx ebx, ah' instruction, and then the following line would need to be changed to 'shr eax, 14'; this would be slightly faster by eliminating one instruction. The remaining instructions process 424, 458 each 6-bit grouping 284. After the $4^{th}$ and $3^{rd}$ groupings are placed in the dl and dh partial registers 254, the full edx register 254 is shifted 406 to move those bytes into proper position for writing 460 to the output buffer 218, thus making room 462 for the $2^{nd}$ and 1st groupings in the low 16 bits of the edx register (the algorithm contemplates that the bytes will be written to the output in little-endian format, so the groupings are processed in seemingly reverse order).

If desired, rather than shifting 406 the $4^{th}$ and $3^{rd}$ encoded bytes into the upper word 288 of the edx register with the 'shl edx, 16' instruction, the dx portion of the edx register could alternatively be written 460 to memory at the proper position via either the edx or the dx register into the output buffer (at [edi+2]; if writing the full edx register at this position, the next two bytes are also modified, but they will later be overwritten with their proper values, which would have the same result as writing only the dx register), and once the following instructions load 404 dh and dl with the $1^{st}$ and $2^{nd}$ encoded output bytes, they could be written 460 via the dx register (only two bytes, since the next two bytes—from the previous write—should be preserved) to their appropriate position 256 in the output buffer (as a two-byte word at [edi]); then, the write into the buffer after the .EndOfCoreProcess label would no longer be needed. The current method, with the edx register being loaded 404 with all four output bytes 282 before being written 460 after the .EndOfCoreProcess label, is believed to generally be faster on most Intel-compatible CPUs.

Note that one of skill could slightly change the sequence of CPU instructions 116 in this algorithm (and others in the present disclosure), as long as no register dependencies 260 are broken. For example, the 'shl edx, 16' instruction could be moved down one or two positions, but not before the next load of the dh register which depends on the value of edx first being shifted; this change could slightly speed up the loop execution speed on certain CPUs due to an internal penalty that can be imposed when partial registers (such as dh or dl) are modified. Additionally, one of skill could reassign usage of certain registers, if desired, i.e., ebx could be used for what ecx is used for, and vice versa.

The counter 290 (ecx) is adjusted 446, and the edi register is also adjusted 446 to reflect that four bytes were written, and the four encoded bytes are written 460 to the proper position in the output buffer. In this way, the ecx register acts as an index 216 for esi in a manner that esi need not be updated with every loop. As long as the ecx register is negative once adjusted at the end of each loop, control will branch 442 back to .MainLoop. When it is no longer negative, it means either that it is time to insert 450 a CR/LF pair 248, or there are no more source bytes to encode (when epb is 0). When a CR/LF pair is needed, it is inserted into the output buffer and the source (esi), destination (edi), line counter (ecx), and total source bytes counter (ebp) are updated 446; control branches 442 back to .MainLoop as long as there are more source bytes to encode.

When the total source counter 290 (ebp) becomes 0, there are no more source bytes and the encoding process is almost complete, and the ecx register will indicate 432 if any additional processing 430 is to be done before exiting. It is possible that the last 24-bit grouping 224 was not complete: the ecx register at this point will be 0 if it was complete, 1 if one byte was missing and the encoding will be padded with 0 bits, or 2 if two bytes were missing and the encoding will be padded 232 with 0 bits. When ebp is detected as being 0, control jumps to an aligned instruction (aligned to make it process faster) that uses ecx as a scaled index 216 into a jump table 238 (Tbl.JmpEncode64) that contains the three addresses 262 to handle the three cases for the ecx register: if it is 0, control follows a branch 240 to the .Finish.0 label; if it is 1, control branches to the .Finish.1 label; and if it is 2, control branches to the .Finish.2 label. Here is one way to create 466 the jump table 238 used in this example; creation can be located either in a code section 264 or in a data section 266 in assembly language 268 implementations 270:

| | Tbl.JmpEncode64: |
|---|---|
| dd | Encode64Chunks.Finish.0 |
| dd | Encode64Chunks.Finish.1 |
| dd | Encode64Chunks.Finish.2 |

At .Finish.0, a null byte 272 is written 460 to the end of the buffer (writing a null to terminate the encoding may not be necessary, depending on how the output buffer will be used) and the ebp register is restored 468 so the local variable Dest can be accessed. The eax register will be set to point to 480 the encoded output buffer, the ecx register will be adjusted 446 to equal the count 230 of encoded output bytes in the buffer 218, saved 438 registers are restored 468 in proper order and sequence, and control returns 470 to the caller 274.

At .Finish.1, since the process read one byte too many, the output is incorrect and needs to be adjusted 446. The third encoded byte is incorrect because it used the low four bits of the second source byte and then the two high bits of the next byte in memory, but since that byte may not have been 0x00, it may have caused non-zero bits to be used for the index. To correct this, the last valid source byte is re-read 472 (it is located one byte to the left of where esi currently points). Its low four bits should be the top four of a six-bit index, so it is shifted 406 left by two bits (the low bits are now filled with 0 bits for padding, as required) and masked 416 to isolate the proper bits. It can now be used as the index 216 to obtain the proper $3^{rd}$ encoded output byte; an equal sign '=' is combined 474 into the edx register to replace the $4^{th}$ byte, the two are written 460 to the proper location in the output buffer 218, and the routine is then exited 464 after restoring 468 key registers (in proper order and sequence), setting eax to point 480 to the encoded output buffer, and the ecx register adjusted 446 to the proper size.

At .Finish.2, the process read two bytes too many, so the output is incorrect and will be adjusted 446 in a manner similar to .Finish.1. The second encoded byte is incorrect because it used the low two bits of the first source byte and then the four high bits of the next byte in memory, but since that byte may not have been 0x00, it may have caused non-zero bits to be used for the index. To correct this, the last valid source byte is re-read 472 (it is located one byte to the left of where esi currently points). Its low two bits should be the top two of a six-bit index, so it is shifted 406 left by four bits (the low bits are now filled with 0 bits for padding, as required) and masked 416 to isolate the proper bits, as shown. It can now be used as the index to obtain the proper $2^{nd}$ encoded output byte; two equal signs '==' are combined 474 into the edx register to replace the $3^{rd}$ and $4^{th}$ bytes to indicate two characters were missing, the three bytes (plus a null in the 4th byte) are written to the proper location 256 in the output buffer, and the routine is then exited 464 after restoring 468 key registers (in proper order and sequence), setting eax to point to the encoded output buffer, and the ecx register adjusted to the proper size.

Note that one of skill could adjust the Encode64Chunks method to not require or use a stack frame 276 using the ebp register. Additionally, one of skill could unroll 476 the main loop if desired; note that this is easiest for the case where the CR/LF pair is not inserted 450. These possible adjustments by one of skill apply to all encoding methods described in the present disclosure and are considered part of the teachings provided herein. Additionally, in some cases where the source buffer is known to be both writeable and guaranteed to be large enough, one of skill could add two null bytes at the end of the source data before processing any source bytes. Then, the code at addresses .Finish.1 and .Finish.2 could be simplified, since the extra one or two bytes that would have been encoded would always consist of zero bits and would not have to be reset to 0s; then the trailing equal '=' sign(s) could be placed in proper position and the function properly exited.

Encode64-B

This method is very similar to Encode64-A, but involves slight modifications to the above Encode64Chunks process. In addition to the Tbl.Encode64.First lookup table 204, it uses two additional lookup tables 292 after Tbl.Encode64.First:

```
Tbl.Encode64.Third:   ; 1024 bytes
; Grab bytes from Tbl.Encode64.First, shift 16 to the left,
;   then store
repeat 256
    load a byte from Tbl.Encode64.First + % − 1
    dd a shl 16
end repeat
Tbl.Encode64.Fourth:   ; 1024 bytes
; Grab bytes from Tbl.Encode64.First, shift 24 to the left,
;   then store
repeat 256
    load a byte from Tbl.Encode64.First + % − 1
    dd a shl 24
end repeat
```

The above tables 292 utilize FASM directives to create 466 the tables and are understood by those skilled in the FASM assembly language. Note that Tbl.Encode.Third creates 256 dwords by copying each of the 256 bytes from the Tbl.Encode64 table and shifting 406 them over two bytes (16 bit positions) to the left, while Tbl.Encode.Fourth creates 256 dwords in the same way, but shifts 406 them over three bytes (24 bit positions) to the left.

Once the above tables exist, the code for this method is the same as for Encode64-A except for the main loop 278. The code between the .MainLoop and .EndOfCoreProcess labels in method A will be replaced with the following lines of instruction code:

```
.MainLoop:
    mov eax, [esi + ecx]
    bswap  eax ; convert from little- to big-endian
    movzx  ebx, ah                    ; get 4th
    shr eax, 14                       ; isolate 3rd
    mov edx, dword [Tbl.Encode64.Fourth + ebx * 4]
                                      ; encode 4th
    movzx  ebx, al                    ; get 3rd
    shr eax, 6                        ; isolate 2nd
    or edx, dword [Tbl.Encode64.Third + ebx * 4] ; encode
                                      ; 3rd
    movzx  ebx, al                    ; get 2nd
    shr eax, 6                        ; isolate 1st
    mov dh, byte [Tbl.Encode64.First + ebx] ; encode 2nd
    movzx  ebx, al                    ; isolate 1st
    mov dl, byte [Tbl.Encode64.First + ebx] ; encode 1st
.EndOfCoreProcess:
```

The above method B first takes advantage of the fact that as soon as the bytes are converted 402 to big-endian format, the $4^{th}$ group can be directly accessed 404 by the ah register 254 (this change could also be made to Encode64-A for a slight speedup). Then, using 32-bit entries 294 in Tbl.Encode64.Third and Tbl.Encode64.Fourth removes 434 a shift of the edx register, for another slight speed gain. The Tbl.Encode64.First table is then used to encode 424 the $2^{nd}$ and $1^{st}$ source bytes. The remaining aspects of this algorithm are the same as for the Encode64-A method.

Encode64-C

This method C processes 424 the 24-bit source in 12-bit chunks and uses the following two lookup tables 292 (this table assumes that Tbl.Encode64.First has also been first created 466):

```
Tbl.Encode64.First12Bits:   ; 8k in size
; Grab bytes from Tbl.Encode64.First,
;   create 64 × 64 table of word entries
repeat 64
    load a byte from Tbl.Encode64.First + % − 1
    repeat 64
        load b byte from Tbl.Encode64.First + % − 1
        dw (a shl 8) + b
    end repeat
end repeat Tbl.Encode64.Second12Bits:   ; 16k in size
; Grab bytes from Tbl.Encode64.First,
;   create 64 × 64 table of dword entries
repeat 64
    load a byte from Tbl.Encode64.First + % − 1
    repeat 64
        load b byte from Tbl.Encode64.First + % − 1
        dd (a shl 24) + (b shl 16)
    end repeat
end repeat
```

The two above tables 292 are created 466 via FASM directives that create all combinations of a 64×64 matrix of the contents 294 of Tbl.Encode64.First, which allows for immediate Base64 encoding of any 12-bit source grouping 224. The first table, Tbl.Encode64.First12Bits, stores these encoding combinations in double-byte word format. The second table, Tbl.Encode64.Second12Bits, creates the same matrix, but stores it in the upper half word 288 in quad-byte dword format. This allows the values to be immediately placed into the proper half of the edx register 254. Note that when implemented on a big-endian-format CPU 212, the order of the bytes stored (denoted by 'a' and 'b' in the above) may need to be reversed 402, and the two tables may need to be switched; one of skill would be able to implement the small changes needed for all algorithms in the present disclosure to account for the change in endianness.

Following is a source code snippet for the Encode64-C method, which replaces the code between the .MainLoop and .EndOfCoreProcess labels in the Encode64Chunks process:

```
.MainLoop:
    mov eax, [esi + ecx]
    bswap eax ; convert from little- to big-endian
    mov ebx, eax            ; copy
    shr eax, 8              ; move 3rd and 4th to position
    shr ebx, 20             ; isolate 1st and 2nd
    and eax, 0xfff          ; isolate 3rd and 4th
    mov edx, dword [Tbl.Encode64.Second12Bits + eax * 4]
                            ; table is 16k
    mov dx, word [Tbl.Encode64.First12Bits + ebx * 2]
                            ; table is 8k
.EndOfCoreProcess:
```

In the above method, after accounting for endianness, the source bytes are copied from eax to ebx. The eax register 254 is then adjusted (to isolate the 12 bits representing the $3^{rd}$ and $4^{th}$ groups) so it can be used 410 as an index into the Tbl.Encode64.Second12Bits table to obtain the $3^{rd}$ and $4^{th}$ encodings; eax first has the high bits cleared 418 to zero so the index stays in the proper range. The ebx register is adjusted so it can be used as an index into the Tbl.Encode64.First12Bits table to obtain the 1st and $2^{nd}$ encodings; the right shift 406 has the effect of clearing the high bits so that when it is used as an index it remains in a valid range. The values are loaded into the edx register in the proper order: the Tbl.Encode64.Second12Bits table is accessed first, since when it is loaded is completely overwrites the edx register. Then the Tbl.Encode64.First12Bits table is accessed to load the lower half of edx (the dx register). The remaining aspects of this algorithm are the same as for the Encode64-A method.

Encode64-D

This method D processes 424 the source 214 in 24-bit chunks directly. Although the code appears to be the simplest of the four Base64 encoding methods described in the present disclosure, it takes the most work to initialize and consumes the largest amount of memory 114. For example, one implementation 270 uses 64 MB of lookup-table data and involves initialization 466 of over 16 million dword entries 294 in that table 204. The table can be created programmatically and initialized by the process 296 that will use it; alternatively, it can be created by the same or another process 296 and stored statically in memory 114, able to then be loaded by whichever process needs it.

In designing the format of the Tbl.Encode64.24Bits table, a choice was made to avoid 434 using the BSWAP instruction during the core Base64 encoding loop in order to speed up execution of that loop. This can be accomplished by taking into account endianness of the CPU 112 when creating the table 204. This particular table 204 has functionality designed to allow any 24-bit number to be able to immediately access the correct encoding 222 for each specific value, taking into account that the 24-bit number being used represents a little-endian ordering of the source bytes. To account for all possibilities, $2^{24}$ (or 16,777,216) entries 294 are created 466.

To create this table for use on little-endian CPUs 210 (such as Intel-compatible CPUs), a 64 MB memory buffer is used; it can be allocated by a memory-allocation operating system call, for instance. For example, create a loop to handle all numbers from 0 through 16,777,215. Using each number as an index into the table, convert that number into a Base64 encoding by assuming that number represents a 32-bit read and is represented in little-endian-format in a register 254. To process it then, use the code from the inner loop of the Encode64Chunks Function described in the Encode64-A method above to create the proper Base64 encoding (alternatively, the core process of any of the other Base64-encoding methods could be used, provided the tables they access are available); then store that encoded value into the current indexed entry of the table. To create the table for use on big-endian CPUs 212, eliminate the BSWAP command in the encoding portion when creating the Tbl.Encode64.24 Bits table.

The following sample code shows one method of creating 466 such a table 204 via a function called Encode64Create24BitTable that has been tested by inventor Eric Ruff on a Windows Vista system (marks of Microsoft Corporation). A four-byte memory variable (Tbl.Encode64.24 Bits in this case) is used to store the pointer to the allocated memory. FASM syntax is used (one of skill will recognize the operating system calls related to allocating memory 114 from the heap):

```
TABLE_24BIT_NUM_ENTRIES = 0x1000000
Encode64Create24BitTable:
    invoke GetProcessHeap
    ; allocate dword entries for table...
    invoke HeapAlloc, eax, 0, TABLE_24BIT_NUM_ENTRIES * 4
    mov dword [Tbl.Encode64.24Bits], eax
    test eax, eax            ; was memory allocated?
    jz .NoAllocation         ; if no, go here
    ; Init the table!
    push edi
    mov edi, eax             ; ptr to allocation
    xor ecx, ecx ; counter and current value to encode
.Loop:
    mov eax, ecx             ; work with a copy
    bswap eax ; convert from little- to big-endian
    shr eax, 8               ; isolate 4th
    movzx ebx, al            ; get 4th
    shr eax, 6               ; isolate 3rd
    mov dh, [Tbl.Encode64.First + ebx]; encode 4th
    movzx ebx, al            ; get 3rd
    shr eax, 6               ; isolate 2nd
    mov dl, [Tbl.Encode64.First + ebx]; encode 3rd
    shl edx, 16              ; shift into position
    movzx ebx, al            ; get 2nd
    shr eax, 6               ; isolate 1st
    mov dh, [Tbl.Encode64.First + ebx]; encode 2nd
    movzx ebx, al            ; get 1st
    mov dl, [Tbl.Encode64.First + ebx]; encode 1st
        ; edx has value to store, increment counter...
    add ecx, 1               ; go to next entry
    cmp ecx, TABLE_24BIT_NUM_ENTRIES
    mov [edi + ecx * 4 – 4], edx ; store table entry
    jb .Loop
    ; Finished, so restore regs and exit
    pop edi
    ret
.NoAllocation:
    ; Could not allocate memory, so show error and return
    stc
    ret
```

Once the Tbl.Encode64.24Bits table 204 is initialized 466 and available, the Encode64Chunks method above can be used, after two modifications. First, the ebx register 254 is initialized to point 480 to the start of the table 204 so that it is immediately available in the main loop 278. This should be done before jumping to the main loop with the following instruction before jumping to .MainLoop (the proper position is shown in the Encode64Chunks code below at the address label .GotCount, but is commented out):

```
mov ebx, [Tbl.Encode64.24Bits]
   ; point to huge allocated table
```

This instruction loads the address 262 of the allocated memory buffer. In some embodiments, this buffer will be in global memory, in which case the memory address is directly available and need not be entered into the ebx register (in which case the code that accesses the table refers to the table by name in place of using the ebx register; or if using ebx is preferred, ebx gets loaded with the address of that buffer rather than the contents located at the start of the memory address).

Next, the following code replaces the code between the .MainLoop and .EndOfCoreProcess labels of the Encode64Chunks method:

```
.MainLoop:
    mov eax, [esi + ecx]
    and eax, 0xffffff ; isolate three source bytes for
index
    mov edx, [ebx + eax * 4]
.EndOfCoreProcess:
```

Since the fact that the source is accessed in little-endian format when accessed via 32-bit loads on Intel-compatible CPUs 210 was taken into account during creation of the Tbl.Encode64.24Bits table, no BSWAP command is needed. The core instructions are therefore straightforward: 32 bits are accessed as in the other methods, the upper 8 bits are cleared to create a 24-bit index, and the value is then Base64 encoded by indexing the table via the ebx and scaled eax registers. For big-endian CPUs 212, the Tbl.Encode64.24Bits table 204 would be created as described above (without need of a BSWAP command), and instead of ANDing the eax register, it would instead be sHIFTed right by 8 bits. The remaining aspects of this algorithm are the same as for the Encode64-A method.

Encode64-E

The execution speed of this method E proved in testing to be the fastest core method; it uses a lookup table 204 of 1 MB in addition to a tiny 256-byte lookup table. The implementation 270 herein described is for use on little-endian CPUs 210; an implementation for big-endian CPUs 212 is slightly less complex, and one of skill could make the slight adjustments needed so that the method E works in big-endian CPU environments.

To understand how this method works, consider the bit layout of the data being converted. Three source 214 bytes (24 bits total) are shown below with the bit offset for each byte, and then with the bit groupings according to the encoding method described in the RFC 4648 specification. Note that all of Group 1 is contained in Byte 1; the first two bits of Group 2 are in the low end of Byte 1 with the remaining four bits in the high end of Byte 2; the first four bits of Group 3 are in the low end of Byte 2 with the remaining two bits in the high end of Byte 3; and all the bits of Group 4 are in the low end of Byte 3. The relative bit position of each Group within each of the source bytes does not change even when the bytes are reversed, but they should be carefully tracked. Here is how the data exists in memory:

| Bit Groups in Memory | | | |
|---|---|---|---|
| Data: | \|Byte 1 | \|Byte 2 | \|Byte 3 \| |
| Bytes: | \|7 6 5 4 3 2 1 0 | \|7 6 5 4 3 2 1 0 | \|7 6 5 4 3 2 1 0\| |
| Groups: | \|5 4 3 2 1 0 \| 5 4. | 3 2 1 0 \| 5 4 3 2.1 0 \| 5 4 3 2 1 0\| |
| Group #: | \|1 1 1 1 1 1 \| 2 2.2 2 2 2 \| 3 3 3 3.3 3 \| 4 4 4 4 4 4\| |

When these data bytes are read via a multi-byte access instruction 116 by a big-endian CPU 212, the left-most byte will always be the high byte in the CPU registers 254, which means the bit groupings will remain in the same order indicated above and can be dealt with in a fairly straight-forward manner. When they are accessed by a little-endian CPU 210, however, the left-most byte will always be the low byte in the CPU registers, causing the bit groupings to become separated and therefore more complex to deal with, as will be shown below. The current little-endian algorithm now described first processes 424 the six bits from Group 1 (they all exist in Byte 1 and are therefore easily dealt with) after reading Byte 1, and it then processes 424 the remaining 18 bits from Groups 2, 3, and 4 after a multi-byte read 404 of Bytes 2 and 3 and after the Group 2 bits from Byte 1 are isolated and shifted 406 into proper position.

After reading Byte 1 into the low part of the eax register, the high six bits represent Group 1. A special table Tbl.Encode64.FirstNoBSWAP 204 is then indexed to obtain the encoded output byte for Group 1, which is placed in the low byte of the edx register 254. Then, because the low two bits of Byte 1 are part of Group 2 and are needed to properly encode Group 2, they are isolated 482 with an AND instruction 116 and then shifted 406 to position as the top two bits of an 18-bit index that is being prepared. Bytes 2 and 3 contain the remaining bits of Group 2 and all the bits for Groups 3 and 4, and they are read into the low half of the eax register (the ax register) and are reversed in the process. Once this read is complete, the low 24 bits of the eax register will look like this (each of the top 14 bits of the 32-bit eax register will be cleared to zero):

| Bit Groups in EAX Register | | | |
|---|---|---|---|
| Data: | \| Byte 1 | \| Byte 3 | \| Byte 2 \| |
| Bytes: | \|- - - - - - 1 0 | \|7 6 5 4 3 2 1 0 | \|7 6 5 4 3 2 1 0\| |
| Groups: | \|- - - - - - 5 4 | \|1 0.5 4 3 2 1 0 | \|3 2 1 0.5 4 3 2\| |
| Group #: | \|- - - - - - 2 2 | \|3 3.4 4 4 4 4 4 | \|2 2 2 2.3 3 3 3\| |

The resulting 18-bit index will be used 410 to access the appropriate 32-bit entry 294 from the Tbl.Encode64.SecondNoBSWAP table 204, which will place encoded output bytes 2, 3, and 4 into the proper position of the edx register, which will then be written 460 to the output buffer at the end of the loop.

The first table 204, 292 is relatively easy to create 466 and can be created via the following code snippet which creates a static table (one of skill could decide to create this table with code that performs a similar function at some point prior to using the table, if desired):

```
Tbl.Encode64.FirstNoBSWAP:
repeat 256
  ; Used to encode 1st byte
    load a byte from Tbl.Encode64.First + ((% -1) shr 2)
    db a
end repeat
```

Note that this assumes the 256-byte table Tbl.Encode64.First already exists. It makes a special 256-byte copy of that table by acknowledging that each value used to index it has the important information in the upper six bits, and the expected value in the new table would be the value from the original table that results from that indexed value being shifted 406 right two places.

The second table 204 can be created statically by the following FASM directives (one of skill could decide to create 466 this table programmatically with code that performs similar functionality at some point prior to using the table, if desired):

```
Tbl.Encode64.SecondNoBSWAP:
; Table to use to encode 2nd, 3rd, and 4th bytes
repeat 1 shl 18
    n = % − 1
    g2 = ((n and 0x30000) shr 12) or ((n shr 4) and 0xf)
    g3 = ((n shl 2) and 0x3f) or ((n shr 14) and 3)
    g4 = (n shr 8) and 0x3f
    load a byte from Tbl.Encode64.First + g2
    load b byte from Tbl.Encode64.First + g3
    load c byte from Tbl.Encode64.First + g4
    dd (a shl 8) or (b shl 16) or (c shl 24)
end repeat
```

A goal for this table 292 is to include a 32-bit entry 294 for every possible 18-bit value ($2^{18}$ entries=262,144 entries×4 bytes each=1 MB table size) that will represent the proper encodings 222 for that value in order to create the $2^{nd}$, $3^{rd}$, and $4^{th}$ output bytes. Each 32-bit entry will have the low byte clear so it can be OR'd 484 with the $1^{st}$ byte that will have already been placed into the low byte of the edx output register. Each value is carefully created based on the actual positions of the bits from each of Groups 2, 3, and 4 as they exist in the eax register that is used to index the table (refer to Bit Groups in EAX Register).

For example, to put the bits for Group 2 into proper sequence in order to properly encode Group 2, bits 17 and 16 (which are the low bits of byte 1) are isolated and then moved into proper position 12 bits to the right; then low bits which are currently in position as the high bits of Byte 3 are shifted into proper position four bits to the right and masked off, and then OR'd with the top two bits. This creates the proper value for Group 2 which is temporarily inserted into the variable 'g2'. Refer to Bit Groups in EAX Register above to see exactly where the bits of each Group are currently located.

Similarly, the bits of both Group 3 and Group 4 are rearranged and placed into the variables 'g3' and 'g4', respectively as indicated by the directives above and as seen in the layout above. Then, each of those variables ('g2', 'g3', and 'g4') are used as indexes into the Tbl.Encode64.First table to create the temporary encoded values 'a', 'b', and 'c', which are then finally combined to create the 32-byte entry for the current index position of the Tbl.Encode64.SecondNoBSWAP table as shown above.

One advantage of these tables is that the BSWAP command is avoided 434 during execution of the core inner loop, thereby speeding up encoding. With the two above tables 204 ready to use, this encoding method E can be further implemented by replacing the code between the .MainLoop and .EndOfCoreProcess labels in the Encode64Chunks process of the Encode64-A method with the following code snippet:

```
.MainLoop:
    movzx  eax, byte [esi + ecx]   ; get first byte
    movzx  edx, byte [Tbl.Encode64.FirstNoBSWAP + eax]
    and eax, 3                     ; isolate two low bits
    shl eax, 16
    mov ax, word [esi + ecx + 1]   ; get next two bytes
    or edx, dword [Tbl.Encode64.SecondNoBSWAP+eax*4]
.EndOfCoreProcess:
```

In this code, the first byte is read into the eax register which is then used 410 as an index into the Tbl.Encode64.FirstNoBSWAP table to place the first encoded byte into the low byte of the edx register. Then the two low bits of eax, which represent the upper bits of Group 2, are isolated and shifted 406 into position in the low portion of the high word of eax. The next two source bytes are then read into eax, which is now the proper index to retrieve the remaining encoded output bytes, which are OR'd into proper position of the edx register. The remaining aspects of this algorithm for method E are the same as for the Encode64-A method.

Discussion above is focused on using the first byte 282, rather than the last, but it will be understood that other approaches are consistent with the teachings herein, such as using one of three consecutive source bytes 282 as a first index, the remaining two bytes then being combined with a portion of said first byte to generate a second index, and so on.

Encode64-F

This algorithm F is an unrolled version of Encode64-E. The logic for handling CR/LF insertions 450 has been removed 434 and the core inner-loop process was manually unrolled 476 eight times so that it encodes 24 source bytes during each loop 278 iteration instead of three source bytes. In order to determine 486 the number of loop iterations, the size of the source bytes to encode is divided by the number of source bytes handled in the inner loop (in this case, 24) to determine the number of loops to execute; the remainder, if any, is handled by the Encode64-E algorithm normally with a jump to the .GotCount label of that algorithm.

Rather than using relatively slow division, a MagicNumber 298 multiplication 488 could have been used instead to slightly speed up processing; in this case, a MagicNumber of 0xaaaaaaab with a shift of 36 would work (i.e., after multiplying the size by the MagicNumber, right shift the edx register by 4 to obtain the quotient in edx). FIG. 3 illustrates some MagicNumber values for use in some embodiments. In this disclosure, the term "MagicNumber" denotes a positive number that is used in an integer MULTIPLY operation (sometimes followed immediately by one or more RIGHT-SHIFT operations), to replace a DIVIDE operation of a positive integer dividend by a positive integer divisor. A suitable MagicNumber is selected based on input range. Whether regular division or a MagicNumber is used at this point, the computed result will be the same: no additional logic to check for the end of source is required, allowing execution to proceed more quickly. Then, after the unrolled loops have done all they can, control branches 442 to a separate loop to handle any remaining bytes where the end-of-source logic 430 occurs at the end of each loop.

The core inner loop is manually unrolled 476 to interleave instructions 116 which, on some CPUs 112, can speed up processing, while on others it should not slow things down. The source and destination locations (offsets to esi and edi) are updated with numeric offsets generated by assembly-time variables and FASM directives that insert the proper offsets at each instruction that reads the source or writes the output.

When all iterations of the main loop 278 have finished, if there was no remainder, the process ends cleanly. If there was a remainder, the registers are setup properly (in accordance with the function that will be jumped into) and control jumps into the previous Encode64-E algorithm to finish processing 430; note that any of the above encoding algorithms could be called upon to process the remaining source bytes (fewer than 24 in this embodiment). One of skill would note that to enable jumping from the inside of one function into another, the stack frames 276 and registers 254 on the stack should be setup identically. Alternatively, portions of code from the other algorithm could be incorporated into the main Encode64_E_Unrolled function by one skilled in the art so as to avoid having a second separate function to finish the remaining bytes.

For clarity, example code is given for the Encode64-F function 244 (Encode64_E_Unrolled), which assumes that the tables 204 identified for the Encode64-E function are first properly created and initialized; see Code Example 2 at the end of the specification.

A Faster Method for Base64 Decoding

Base64-encoded data 222 will eventually be decoded 426; decoding 426 is expected to occur at least as frequently as encoding 424. Having a much faster method to decode Base64-encoded data streams (hereafter, "encoded data" or data 222), regardless of how that data was encoded (according to methods herein or otherwise) would be useful in helping increase both apparent and actual response times (either measured or perceived). In a client-server context 100, for example, after encoded data is sent to a client 102 pursuant to a request it will normally then be decoded prior to being used, referenced, or displayed. Decoding large streams, or many small streams, can take substantial time; faster decoding methods would be useful.

As explained above, each group 224 of three source 214 bytes (each with eight bits, or 24 bits total for the group) will be encoded 424 into four Base64 characters 284, each of which utilizes only the lower six bits, leaving the upper two bits of each byte clear, for a total of 32 bits. Some encoded data will additionally contain CR/LF pairs 248 after every 64 encoded bytes, some will contain CR/LF pairs 248 after every 76 bytes, some possibly will contain CR/LF pairs 248 at other fixed intervals, and some will contain CR/LF pairs 248 at variable intervals. Some encoded source streams to be processed by a decoder 228 will have no CR/LF pairs, while some could have only CR characters or only LF characters. As mentioned previously, there can also be slightly different encoding tables in use. It would thus be helpful to design a decoding process that could gracefully and seamlessly handle all of these decoding scenarios, regardless of whether the encoding was done conventionally or by innovative tools and techniques described herein.

The length 223 of the encoded data can be specified in advance, or the length may be unknown and so is inferred by inspecting the stream. The end of the stream of data 222 could be specified by a NULL character, or the decoding algorithm could decide it is at the end of the encoding as soon as an equal '=' sign or some other designated character(s) is encountered. There could be supplemental items 215 such as a header, and/or a footer, and/or CRC or other checksum data that can be used to validate the encoded content 222. Each of these issues should be taken into consideration in creating an algorithm that will decode Base64-encoded data as desired.

Some embodiments traverse part or all of the encoded data 222 looking for index-62 chars, index-63 chars, pad chars, fixed line-length, maximum line length, CR/LF line separators, non-alphanumeric characters, and/or line checksums (which may include a pad character). Based on what is found, the particular implementation 270 used by the encoding can then be identified, and corresponding decoding tables 205 can then be used (or generated 466, or generated and then used).

Some familiar decoding solutions will first traverse the entire encoded data 222 searching for invalid characters while counting the valid bytes in order to determine both the number of valid characters and the size of any needed destination output buffer; if any invalid characters are found, the decoding will be deemed to have failed. In some implementations, a copy of the encoded data is produced which has all CR/LF characters stripped and has no invalid or extra characters.

In this context, if a first counting pass with validity checking is desired, it can be helped by using a table-based method to traverse through the data stream 222, whereby each source character 284 is used as an index into a jump table 238, similar in function to other jump tables described in the present disclosure, where such jump table has been preconfigured to jump to a unique point in a code path based on the type of byte encountered (such as CR or LF char; or valid char; or invalid char; or equal sign; etc.). For instance, in some embodiments the CR and LF chars each cause control to jump 442 to a point that handles the occurrence of either one, or both, of these characters to determine whether they are in a valid position; if they exist, they should be at an offset evenly divisibly by four after the last occurrence of either the CR or LF; and depending on the implementation, a CR should always immediately precede, and be accompanied by, a LF. The number of CR and LF chars can be counted and removed from the total count to determine the size that the decoded data will occupy. Additionally, the position of a valid equal sign in the encoded stream should be either the third or the fourth character of the last four-character group, and any invalid placement of an equal sign could be handled (in some current methods, any invalid characters in the stream will encode for that position as though all bits were clear; other implementations reject the source stream as invalid).

In addition, it is possible in some scenarios that a null character, or some other character(s), would determine the end of the encoded data 222 and could be searched for during the counting pass. In some embodiments, some or all the functions of the counting pass are embedded in the decoding pass, and if necessary, the output size has been estimated as described below.

The decoding algorithms described below assume the encoded data 222 is acceptable for decoding, the size of the source 214 is known and passed to the decoding procedure 246 as a parameter 243, and an adequate output buffer 218 has been selected. A policy in some embodiments, however, is to exit 464 the decoding process as soon as an equal sign is encountered as either the third or the fourth character, irrespective of the size parameter; alternatively, in some embodiments an early equal sign even in a valid position is handled as any other valid character 284, in some it is ignored and skipped, and in yet other embodiments it is used to determine that the process should exit at that point.

Although the exact size 247 of the total decoded data 221 may not be known in advance, it is known that since there are exactly three decoded bytes for every four valid source bytes, the output will be 75 percent (or ¾) of the size of the source (ignoring the size of any header, footer, CRC, or other encoding supplemental elements 215 that would be known beforehand and contemplated in calculating the estimated output size); therefore, the output buffer is 75% of the size of the input buffer. It is therefore easy to compute a maximum size for the output and to allocate a buffer 218 of that size 219 without needing to first count the source bytes. Such a size 219 is estimated in just two assembly statements; it is an estimate and therefore will usually be slightly bigger than what is needed. Note that the value 4 is added to the estimated total to account for loss of precision when shifting, and to ensure there is at least one extra byte available to null-terminate the output buffer (if so desired):

```
; Calculate size times 75%, quickest known method:
    shr ecx, 2      ; divide size by four to get 25%
    lea ecx, [ecx + ecx * 2 + 4]      ; three times 25%, plus 4
```

Note that FASM macros are used to push and pop registers 254 on the stack 277; pushregs will push 490 the specified registers in the order specified, while popregs will pop 491 them in the order opposite to that specified. Pushing and popping registers, and ways to keep track of them, are known to those skilled in the art of assembly-language programming.

Two decoding 426 methods will now be described, with source code shown for particular implementations 270. Decode64_Bytes uses a small 256-byte decoding table 205 and processes the source 214 bytes one at a time. Each byte 282 in the table is the value to be used when indexed by any source byte from the encoded data regardless of the position of the byte in the source code (there are four positions); once the value from the table is obtained, it is appropriately manipulated to piece together the original source bytes as they are decoded six bits at a time. Decode64_Words uses 384 k of table 205 lookup data and processes the source one double-byte word at a time. The tables 205 have meticulously designed functionality: as each word is decoded, the retrieved value has been crafted such that the data bits are in the exact position needed to store them in memory with a little-endian CPU 210. This eliminates 434 the need to shift any decoded bits or to use the BSWAP instruction, thereby substantially increasing execution speed. One of skill can modify the tables 205 and these algorithms for use on big-endian CPUs 212, which can be simpler to write computer code for due to the fact that the byte order inside big-endian CPU registers matches the order for the bytes in memory 114, which simplifies compliance with the RFC 4648 Base64 encoding specification.

Decode64_Bytes

Source code for an example implementation of the Decode64_Bytes algorithm is given in Code Example 3 at the end of this specification. In that code, the ecx register 254 is used 410, 411 as a negative index for the esi register and also as a counter 290; while ecx is negative there is still more source 214 to process. For this to work, the esi register is advanced (prior to entering the main loop for the first time) to point 480 to the end of the source buffer; then while using 411 ecx as a negative offset, the source is accessed in proper sequence. While ecx is negative, the loop 278 has not yet finished. In this manner, execution speeds up due to not needing 434 to constantly update an index that is being used to access the source bytes, unlike familiar methods which perform such updates.

Additionally, intelligent compare statements are used to determine whether a CR or LF has been encountered; if so, control jumps 442 to a point immediately above .MainLoop that simply increments the ecx counter (which has the effect of advancing the inferred source index based on the negative ecx value) so that the CR or LF is skipped 435, 434 and control comes immediately back to the main loop without all the 434 branching instructions that some other approaches use.

This algorithm was designed for use on little-endian CPUs 210, and the bit positions for each decoded byte are carefully placed into proper order accordingly. The proper order can be seen by viewing a map of the bits 280 in the source bytes and how they should be ordered for a proper decoding. Each 8-bit source byte has just 6 bits of data in its group; when they are decoded, three 8-bit bytes of decoded data will be ready to write. When written 460 to the output buffer, the output bits should be in this order in the memory buffer:

| MEMORY VIEW | | | |
|---|---|---|---|
| Data: | Byte 0 | Byte 1 | Byte 2 |
| Group ofs: | 5 4 3 2 1 0.5 4 | 3 2 1 0.5 4 3 2.1 0 | 5 4 3 2 1 0 |
| Group #: | 1 1 1 1 1 1.2 2 | 2 2 2 2.3 3 3 3.3 3 | 4 4 4 4 4 4 |

The bit offsets display with the high bit to the left. In the MEMORY VIEW above, the two high bits (bits 5 and 4) of Group 2 occupy the two lowest bits of Byte 0, with the remaining bits occupying the high portion of Byte 1. All of Group 1 is at the high end of Byte 0, while all of Group 4 is at the low end of Byte 2. And note that all the bits for any group are in consecutive order. But when viewed from the edx register's point of view, the data inside it looks like this (Byte 3, which is not shown, will be all 0 bits):

| REGISTER VIEW | | | |
|---|---|---|---|
| EDX Reg: | Byte 0 | Byte 1 | Byte 2 |
| Group ofs: | 1 0.5 4 3 2 1 0 | 3 2 1 0.5 4 3 2 | 5 4 3 2 1 0.5 4 |
| Group #: | 3 3.4 4 4 4 4 4 | 2 2 2 2.3 3 3 3 | 1 1 1 1 1 1.2 2 |

Note that the bits for Groups 2 and 3 are intermixed with the bits of other groups. It is possible to manipulate the decoded bits for each Group and to place them in the exact order needed as shown in the REGISTER VIEW above, but this can involve multiple AND, SHIFT, and OR instructions 116, which take more execution time 234, unless the values are obtained from a lookup table 205 as described in the Decode64_Words algorithm below. The Decode64_Bytes method instead takes advantage of the BSWAP command 116, which allows the assembling of the decoded Group bits as though the register edx looked like the MEMORY VIEW; then, after all the bits are assembled, the BSWAP command rearranges the bits to the desired order as depicted in the REGISTER VIEW, making the written order of the bits correct.

The four retrieved six-bit values 284 could have been manipulated and put directly into the exact position needed into the edx register, taking into account that this function is designed for a little-endian CPU 210. But doing so implicates more bit-adjustment instructions that could slow down the algorithm on some CPUs 112; therefore, this method uses the BSWAP command to reverse 402 the bytes, which allows the retrieved decoded values 221 to each be moved into position with at most one shift 406 per retrieved value. The BSWAP command can be slow on some CPUs, meaning that the edx register whose bytes are reversed may not be immediately available to be written to the output buffer 218 due to CPU latency or other issues. Therefore, two other instructions have been manually placed 492 out of the ordinary intuitive order at the end of the main loop (these instructions would normally occur after writing the edx register to the output buffer) so that they can operate while the edx register is not yet available due to latency issues related to using the BSWAP instruction. And then, since the edi register was already updated as though the decoded data had been written (but it is just now about to be written), an offset of −3 is used to write the decoded data to the output buffer just before looping 442 back to the top of the loop.

Two 256-byte tables 205 are used by this algorithm: Tbl.Decode.Char (which is directly accessed by the algorithm), and Tbl.Encode64.First (which is used to create Tbl.Decode.Char). Here is one way to create 466 the first table:

```
label Tbl.Decode.Char byte
; This table decodes an encoded byte into its 6-bit value
    db 256 dup (0)
    ; Now, assign values for the valid chars. . .
repeat 64
    load a byte from Tbl.Encode64.First + % − 1
    store byte (% − 1) at Tbl.Decode.Char + a
end repeat
```

The above FASM directives assume the Tbl.Encode64.First table exists since it contains the values used to create this table (it is described above in the encoding section of the present disclosure). The Tbl.Decode.Char table occupies 256 bytes and can be created 466 programmatically before being used, or statically as shown above; it is an inverse of the Tbl.Encode64.First table. Each entry 294 in this table contains the decoded value to return when the index for that entry is accessed. The decoded value returned is the offset into the Tbl.Encode64.First table that contains the value of the encoded character.

In this implementation, code using 410 an encoded character 284 as an index into the Tbl.Decode.Char table returns the decoded value. For example, say the value 'c' was being decoded (and assume that value, which is 0x63, is in the eax register). Using the command 'movzx edx, byte [Tbl.Decode.Char+eax] ' will load the value from that table at offset 0x63, which value is 0x1c, into the edx register while simultaneously zeroing out 418 the high 24 bits of edx; this is because the encoded character 'c' is found at offset 0x1c of the table, which is the value used to encode 'c' during the encoding process.

Note that the above Tbl.Decode.Char table is used directly by the Decode64_Bytes algorithm where it is directly referred to for each byte being decoded, and used indirectly by the Decode64_Words table where it is not accessed directly by the algorithm, but is instead used to generate other tables that are accessed directly. This table 205 includes the information needed to decode Base64-encoded source streams, and can be easily adapted to accommodate the decoding of different Base64 versions simultaneously with Base64-encoded data. For example, the last two encoding characters in the Base64 table (plus '+' and forward slash '/' which encode, respectively, with the values 62 and 63) are sometimes replaced with other characters, such as minus '−' and underscore '_' used in the Base64_URL table.

To include in an implementation 270 the ability to use the above Tbl.Decode.Char table 205 for decoding either or both the Base64 and the Base64_URL tables with no other changes to the decoding algorithms, one would add decoding references for those new characters into the table after it is set up to represent the Base64 encoding. This would include placing the value 62 at offset 0x2d in the table (0x2d is the ASCII value for the minus sign) and the value 63 at offset 0x5f (which is the ASCII value for the underscore character). This can be done with the following FASM directives:

```
store byte 62 at Tbl.Decode.Char + '−'
store byte 63 at Tbl.Decode.Char + '_'
```

Once these changes are made, the decoding algorithms described in the present disclosure can be used to decode either Base64-encoded data, or Base64-URL-encoded data, with no other changes, allowing seamless and robust decoding 426 of different types of Base64 encoding streams using a single implementation.

Decode64_Words

Sample code for an implementation of Decode64_Words is provided at Code Example 4 at the end of this specification. The structure for this algorithm is similar to Decode64_Bytes in that ecx is used for both a counter and for a negative index for the esi register. One difference, however, is that this algorithm decodes encoded data a word at a time rather than a byte at a time. The Decode64_Words fucntion has only 16 instructions in its core loop compared to 28 instructions for the Decode64_Bytes version. This Decode64_Words implementation also does not use the relatively expensive BSWAP command which can have high latency on some CPUs.

This decoding algorithm uses a different method of handling CR/LF insertions; when a LF always follows a CR in the source, this method is slightly faster than that used in Decode64_Bytes. The instructions 116 in the core inner loop 278 are simple and are manually adjusted 492 to interleave instructions to help improve speed.

The algorithm will use 410 the first two encoded data bytes as an index into the Tbl.Decode.1stWord table to obtain the proper decoded value which is placed into the lower portion of the edx register 254. Each entry 294 in this table 205 is a double-byte word, and all possible values that could be encountered during decoding of properly encoded data 222 are stored in the table; since there are 64 k entries each two bytes wide, the entire table is 128 k bytes. The second two encoded bytes are then used as an index into the table Tbl.Decode.2ndWord 205 to obtain the proper decoded value which is placed 484 into the higher portion of the edx register via an OR instruction, but with some overlap with the first decoded value in the lower portion of the register. Each entry 294 in this table is a quad-byte dword, and all possible values that could be encountered during decoding of properly encoded data 222 are stored in the table; since there are 64 k entries each four bytes wide, the entire table is 256 k bytes. Additionally, both the Tbl.Decode.Char table and the Tbl.Encode64.First table will have been created 466 (see above) and made available in order to create 466 the two larger tables (these smaller tables are 256 bytes each). The third and fourth source bytes are checked for '=' characters to determine if it's time to exit 464 the main loop. If so, the appropriate operations finish the decoding as shown in the source code, after which the function 246 cleans up and exits. If not, the decoded bytes are written 460 to the output buffer, edi and ecx are adjusted, and control jumps back to the loop start.

The entries 294 in each table were very carefully generated to ensure that the two retrieved decoded values could be correctly interleaved 474 into a register without 434 requiring any shifting 406 or masking 416, and without 434 requiring use of the BSWAP instruction 116. The entries 294 were also designed with functionality that allows the acquiring register (edx in this case) to be immediately written 460 to the output buffer 218 once the source was checked for possible CR/LF values or equal signs.

Much of the hard work is done 426 only once (during creation 466 of the tables 205); then the core algorithm can simply lookup the values it needs, thereby achieving high speeds. The following code snippets show the FASM directives used to cause the assembler 269 to create the tables during assembly 401 so that they are available statically when the decoding functions 246 are loaded into memory 114. One of skill could use the teachings herein to make code to create 466 these tables 205 at any time prior to their needing to be accessed, either programmatically or statically.

```
label Tbl.Decode.1stWord word
;  Used to decode first two Base64-encoded bytes into bits
   repeat 256 * 256
      load b1 byte from Tbl.Decode.Char + ((%-1) and 0xff)
      load b2 byte from Tbl.Decode.Char + ((%-1) shr 8)
      x = (b1 shl 2) or (b2 shr 4) or ((b2 and 0xf) shl 12)
         ; combine bits properly as though using BSWAP
         dw x
   end repeat
label Tbl.Decode.2ndWord dword
;  Used to decode second two Base64-encoded bytes into bits
   repeat 256 * 256
      load b3 byte from Tbl.Decode.Char + ((%-1) and 0xff)
      load b4 byte from Tbl.Decode.Char + ((%-1) shr 8)
   x= (b4 shl 16) or ((b3 and 3) shl 22) or ((b3 shr 2) shl 8)
      ; combine bits properly
         dd x
   end repeat
```

Referring to both the MEMORY VIEW and the REGISTER VIEW above helps understand the instructions 116 used to create 466 the tables 205. One of skill and in possession of the present disclosure would be able to recreate these tables with careful study of the two VIEWs above and by using proper instructions to carefully place each portion of each decoded source-byte value into the proper position after isolating the proper bits to be positioned.

The Tbl.Decode.1stWord table 205 contains word values that represent the decoding for every possible two-byte value, with such values representing the decoded values 221 of any two encoded Bytes 1 and 2. The AND instructions are used to mask 416 and isolate 417 bits, the SHR and SHL instructions are used to move 406 bits into proper position, and the OR instructions are used 484 to combine 474 the bits into proper form. In the core algorithm, this table is accessed first to load edx with the decoded bytes for the first two source bytes. The values in this table leave holes in the bit patterns that are needed and used when values from the second table are merged and interleaved with them; all the top 16 bits of edx, in addition to the low four bits of the second byte of edx, will be clear and properly available when merged with the entry from the second table.

The Tbl.Decode.2ndWord table 205 contains quad-byte dword values that represent the decoding for every possible two-byte value, with such values representing the decoded values 221 of any two encoded Bytes 3 and 4. Since some of the bits are in the low half and some in the top half of each entry, a dword-sized value is used, placing 32-bit entries 294 in this table for each of the 64 k entries, making the table 256 k bytes in size. Like Tbl.Decode.1stWord, the bits represented by the second encoded bytes are carefully masked, isolated, and positioned as shown in the REGISTER VIEW table so they are ready to be merged 474 with the values obtained from the first table and then written 460 to the output buffer.

One of skill could unroll 476 the loops in any of the decoding algorithms for an additional speed gain. In addition, the functions could be designed to not utilize 434 stack frames 276, which would again increase speed; this would be helpful especially in cases where relatively small (i.e., less than 100 bytes) encoded streams 222 are decoded, since that reduces function 246 overhead more noticeably on small decoding jobs.

Base64 Asynchronous Operation: Encoding

The Base64 encoding methods can be made faster by dividing the work between multiple cores, or threads, that execute in parallel. The source byte stream is divided into equal-sized chunks, each of which will be passed to a thread that will encode all the bytes of that chunk using the same Base64 encoding algorithm. As each input chunk is encoded, the output produced is written to a chunk-output buffer that can contain the encoded output (as described below).

In an initial implementation, multiple chunk-output buffers are aligned sequentially in memory to form an aggregate output buffer; preferably, there are no gaps in memory separating the individual chunk-output buffers. An associated aggregate input buffer, comprised of the same number of chunk-input buffers each of which corresponds to a chunk-output buffer (and preferably with no gaps in memory between them), is allocated and/or identified in memory. Preferably, the number of chunk-output buffers is equal to the number of threads being used, although it could be more or less if so desired by one of skill; the encoded output from each input chunk is placed into its assigned chunk-output buffer in a manner so as to retain the same order for the encoded chunks as in the original source stream. Using two (or more) aggregate output buffers improves the asynchronous operations; when one aggregate output buffer has been filled and is being written to the target destination, the next aggregate input buffer can start being filled from the input source stream while the threads process the next input chunks asynchronously. There is at least one aggregate input buffer for each aggregate output buffer.

This approach may work best when implemented to work with a variable number of threads. The number of available threads can be determined by querying the operating system, by querying the CPU, or by another method. This can be equal to the number of available CPU cores, and in some cases can be more, such as when hyper-threading features are available. If desired, the number of threads to use can be lowered so as not to consume all the available CPU processing power. As is known in the art, a skilled implementer would create a supervisor module that creates and then controls the execution threads. This module would ensure that the input buffers are filled and output buffers are flushed appropriately and in sequence, such that the encoded output is stored in the same sequence as the original input. It would assign the various input chunks, in order, to the next available thread, each input chunk to be encoded by an available thread, with the output written to the appropriate position in the appropriate chunk-output buffer. Each time the aggregate output buffer is filled, i.e., all assigned threads have completed their encoding of all the input chunks of the aggregate input buffer, the aggregate output buffer is then written to the appropriate destination; its related aggregate input buffer is then filled with the next unread portion of the input stream. When two or more sets of aggregate buffers are used, the next available aggregate buffers can be used asynchronously while the just-finished output buffer is being flushed. This process continues until the entire input stream has been successfully encoded and flushed to the target destination.

In the present description of asynchronous encoding, the following assumptions are made: the maximum line length is 76; the desired chunk size is approximately 8 k; four cores are available; and one thread per core will be used (note that in some CPU implementations using more than one thread per core may also produce acceptable speeds). Additional features are now described in more detail.

Chunks

A chunk (aka input chunk) size of up to 32 k will fit into the L1 data cache (in memory) of many CPU cores; smaller or larger sizes can be tested to determine what size works best on a given CPU, if desired. In general, when the expected average size of input streams to be encoded is small, smaller chunk sizes are preferred, allowing multiple threads to operate asynchronously. For example, if the average size of an input stream is thought to be around 32K, and if the input chunk size is also 32 k, then in most cases only one core would be used; but if instead an input chunk size of 8 k is used, then on average four cores can be kept busy for a substantial increase in processing speed. Although the input chunk size can be any value, faster execution speeds can result when the chunk size is not greater than the average input-stream size divided by the number of threads used, and when the total size of the input and output aggregate buffers is kept within the size of the L2 cache. If desired, the skilled implementer can determine the size of the L2 cache in order to dynamically customize execution based on the architecture of the individual CPU being used, permitting dynamic adjusting of the chunk sizes and the total size and number of aggregate buffers used.

When a maximum line length is used (such as in the MIME specification, which specifies a maximum line length of 76), the chunk size is based on an exact multiple of that line length. For example, a maximum line length of 76 describes the maximum line length for the encoded output, which produces four output bytes for each group of three source bytes. Therefore, the number of original source bytes, which after Base64 encoding would generate exactly 76 encoded output bytes, is equal to (76/4)×3=57 bytes.

If an input chunk size of approximately 8K bytes is desired, one can calculate that the maximum number of complete lines that could be processed in that input chunk is equal to 8,192 bytes/57 bytes per line=143 lines; the actual size of each input chunk is therefore 143 lines*57 bytes per line=8,151 bytes. Then each input stream would be divided into input chunks of that size (8,151 bytes) and each would be processed by a separate thread.

The aggregate input buffer is comprised of multiple input chunks; the size of this buffer is equal to the number of chunk-output buffers in the aggregate output buffer (described below), times the size of each input chunk. In the present example where four output-chunk buffers are used, the input buffer is then equal to 4 buffers×8,151 bytes per buffer=32,604 bytes. In an initial implementation, there is one aggregate input buffer for each aggregate output buffer, and there are at least two sets of aggregate input/output buffers; as soon as the current aggregate output buffer is filled and starts being written to the target destination, its associated input buffer can be filled with the next unread portion of the input stream, and the next aggregate input buffer and aggregate output buffers are determined and the input is processed asynchronously. In some implementations, there are more aggregate input buffers than aggregate output buffers (there are at least two aggregate output buffers for the best asynchronous performance); in this case, the skilled implementer ensures that an available aggregate output buffer is associated with the next aggregate input buffer to process.

Chunk Output Buffers

When a thread is initiated, it is given a pointer to the start of the input chunk and a pointer to the start of the related chunk-output buffer. For encoding, the chunk-output buffer is larger than the input chunk (the reverse is true for decoding). For the current example using 8,151 bytes for each input chunk, there are 143 source lines. When encoded, each line will be 76 bytes, plus two bytes for a CR/LF pair; the actual size is equal to 143 lines×(76+2) bytes per line=11,154 bytes. When encoding the last chunk, the number of bytes to process will usually be less than the full size of a normal chunk, and the data will be encoded and the output finalized as described elsewhere in the present disclosure.

The speed of execution for the Base64-encoding algorithm does not vary based on the byte content of the input stream; therefore, each thread will require essentially the same amount of encoding time, meaning all threads will complete at nearly the same time (except that the last chunk, being smaller than the others on average, will usually complete sooner). Multiple chunk-output buffers are aligned sequentially, with no byte gap between them, to create an aggregate output buffer. A natural solution is to make the aggregate buffer equal in size to the number of threads to be used, times the size of each chunk-output buffer, or 4 threads×11,154 bytes per thread=44,616 bytes in this example. Having two or more such sets of input and output aggregate buffers allows one aggregate output buffer to be written to the desired output destination at the same time the next set of aggregate buffers is being used asynchronously by the various threads to process additional chunks in sequence, while at the same time the related input buffer for the aggregate buffer being written is being filled with the next portion of the input stream.

Base64 Asynchronous Operation: Decoding

The process to decode asynchronously is the reverse of the asynchronous encoding method. In some cases, it may be faster and less error prone overall to first strip all CR/LF characters from the input stream (which in this case is comprised of Base64-encoded output); in some implementations, all input bytes are also validated to ensure the stream has not been corrupted. After such processing, a maximum line length and the chunk size are determined. Note that when the CR/LF characters are stripped, the line length is arbitrary. But in all cases, the line length used should be equal to an integer times four bytes, since the encoded data is grouped into four 6-bit Base64 characters, each occupying one eight bit-byte. Each input chunk will be larger than its associated output chunk during decoding, since each 32-bit group will be converted into its original 24-bit group.

The input chunks during decoding will be comprised of four bytes for each three bytes decoded and written to the output-chunk buffers; if the encoded input stream is not first stripped of CR/LF characters and/or otherwise verified, the CR/LF characters must be accounted for in determining the size of each buffer. In the event the input is found to be not clean, or if there are not the same number of CR/LF characters for each line of encoded source, the input buffers will need to be adjusted to account for the difference; any method can be used, including moving the data to realign the buffers and to then possibly read extra data into the end of the input buffer (it is for this reason that it may be preferred to first strip out the CR/LF characters and to verify the integrity of the input stream prior to commencing the decode process).

Each thread will be assigned the appropriate pointer to the input chunk buffer and to its associated output-chunk buffer, and the appropriate Base64 decoding algorithm will operate on each chunk. The last chunk will usually be smaller than the others, and will be decoded as described elsewhere in the present disclosure. Once an aggregate output buffer has been filled, it is written to the desired destination, its associated aggregate input buffer is filled from the input stream, and the next aggregate input buffer and aggregate output buffer are used to continue decoding asynchronously.

Some Benefits of Encoding Approaches

Some embodiments described herein eliminate numerous if/then/else statements that slow down processing. Look-up tables are used instead.

Some embodiments reduce or eliminate bit-shifting. Method E uses just one shift and is often the fastest method (the unrolled version, F, can be faster, but it uses the same core algorithm, although unrolled and out-of-order). Method D can eliminate all shifts, but is not as fast as E and uses more memory (64 MB). But on a CPU with a larger data cache (say, 64 MB) this would likely be the fastest conversion method.

Some embodiments include enhancements when doing Base64 encoding on little-endian CPUs. Some allow source bytes to be accessed multiple bytes at a time, thereby speeding up the process. In comparison, known processes access the source data one byte at a time in order to avoid the little-endian CPU issues which otherwise require expensive shifting and masking operations. In some embodiments, time-consuming bit-shifting is avoided by strategically creating conversion tables that effectively shift the bits from the 8-bit source bytes into proper location for 6-bit output via fast and simple look-up operations. In this way, the most expensive bit-manipulation processes will have already been performed at the time the tables were created, outside the execution window of the encoding process.

In some embodiments, the act of adding two nulls at the end of the source data speeds up processing; this can eliminate the need to re-read the last source bytes and can simplify and speed up the step of finalizing the output when the last group of source bytes is just one or two bytes (rather than a full three-byte complement), necessitating the insertion of one or two '=' equal characters into the output stream.

Some table-based methods (A, B, and C) will use substantially less memory than other table-based methods, while delivering fast speed. This reduces data-cache conflicts that would otherwise slow down this and other processes competing for the same cache space on the same CPU.

In some embodiments, the counter register is also used 463 as an index, thereby speeding up processing by eliminating one index pointer (only two variables, which are held in registers in the example source code, need to be updated during each loop iteration). Some known processes must use a separate counter, plus a separate index pointer for the source, plus a separate index pointer for the destination (meaning that three variables—whether held in registers or not—need to be updated during each loop iteration). This improvement applies to both byte- and word-based decoding, and it also applies to encoding methods.

For word-based decoding, some embodiments allow encoded source to be accessed via two 16-bit words instead of as four 8-bit bytes, speeding up accessing. Tables are meticulously created so as to eliminate the need for a BSWAP command when implemented on little-endian CPUs; appropriate tables can be easily created for use on big-endian CPUs, in view of the teachings herein.

In some embodiments, a system 102 includes at least one processor, and a memory 114 in operable communication with the processor(s) 112. The memory contains instructions 116 and at least one table 118 for Base64 data management, and the system is further characterized in at least one of the following ways:

(a) the instructions comprise instructions for a Base64 encoding process which relies on only a single bit shifting operation;

(b) the instructions comprise instructions for a Base64 encoding process which does not rely on any bit shifting operation;

(c) the instructions comprise instructions for a Base64 encoding process which does not rely on any bit shifting operation of data source bytes that are accessed in a single multi-byte read operation prior to using those data source bytes as indexes into an encoding lookup table (note that the values obtained from the tables may be bitshifted from the final encoded values);

(d) the instructions comprise instructions for a Base64 encoding process which accesses source data bytes multiple bytes at a time (e.g., grab four bytes in one instruction) and then encodes at least two of those accessed bytes before accessing additional multiple bytes and then encoding those accessed bytes, possibly with intervening accesses and/or encodings;

(e) the tables effectively shift bits from 8-bit sources into location for G-bit output, thereby avoiding shift operations in instructions for a Base64 encoding process;

(f) the instructions comprise instructions for Base64 encoding according to a set of 64 encoding values, and the at least one table includes a table having four quadrants, each of which contains a copy of the same 64 encoding values;

(g) the instructions comprise instructions for performing a Base64 encoding process which uses 463 a negative value in a register as both a counter and as an index;

(h) the instructions comprise instructions for performing a Base64 decoding process which uses 463 a negative value in a register as both a counter and as an index;

(i) the processor is a little-endian processor, and the table(s) effectively eliminate any need for a BSWAP command in instructions for a Base64 encoding process;

(j) the system comprises data source partitioning instructions which partition 494 a data source into N partitions 495, N being an integer greater than 1, with each of the first N−1 partitions having a length 496 in bytes which is a multiple of three, and wherein the system further comprises encoding concurrency instructions which Base64-encode the partitions concurrently. In some cases, one or more of the first N−1 partitions each have the same length, while in others they each have a different length. In some embodiments, the length of a partition is weighted 497 based on respective processor performance characteristics such as processor speed and/or processor cache size. For example, if three processors have relative speeds of 1.0 (using the slowest processor's speed as a baseline), 1.1, and 1.7, then the partition sizes could have the same (or within a specified tolerance of the same, e.g., 3%) relative sizes, with the second partition 1.1 times the length of the first partition and the third partition 1.7 times the length of the first partition.

CONCLUSION

Although particular embodiments are expressly illustrated and described herein as processes, as configured media, or as systems, it will be appreciated that discussion of one type of embodiment also generally extends to other embodiment types. For instance, the descriptions of processes also help describe configured media, and help describe the technical effects and operation of systems and manufactures. It does not follow that limitations from one embodiment are necessarily read into another. In particular, processes are not necessarily limited to the data structures and arrangements presented while discussing systems or manufactures such as configured memories.

Specific features of an example may be omitted, renamed, grouped differently, repeated, instantiated in hardware and/or software differently, or be a mix of features appearing in two or more of the examples. Functionality discussed as being at one location herein may also be provided at a different location in some embodiments.

Reference herein to an embodiment having some feature X and reference elsewhere herein to an embodiment having some feature Y does not exclude from this disclosure embodiments which have both feature X and feature Y, unless such exclusion is expressly stated herein. The term "embodiment" is merely used herein as a more convenient form of "process, system, article of manufacture, configured computer readable medium, and/or other example of the teachings herein as applied in a manner consistent with applicable law." Accordingly, a given "embodiment" may include any combination of features disclosed herein, provided the embodiment is consistent with at least one claim.

Any apparent inconsistencies in the phrasing associated with a given item or reference number in the text should be understood as simply broadening the scope of what is referenced. Different instances of a given item may refer to different embodiments, even though the same item name is used.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims as filed are part of the specification.

While exemplary embodiments have been described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

Although some possibilities are illustrated here by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways without necessarily omitting desired technical effects from the collection of interacting modules viewed as a whole.

All changes which fall short of enveloping an entire abstract idea but come within the meaning and range of equivalency of the claims are to be embraced within their scope to the full extent permitted by law.

CODE EXAMPLES

Code Example 1

```
        ; Various equates...
ENCODE64_SOURCE_LEN = 3      ; this # bytes per source chunk
ENCODE64_DEST_LEN = 4        ; this many bytes per dest chunk
ENCODE64_BLOCKSIZE = 76      ; evenly divisible by 4!
;   This is the number of bytes in each ENCODE64_BLOCKSIZE:
;   ENCODE64_BLOCKSIZE_SOURCEBYTES = (ENCODE64_BLOCKSIZE /
;        ENCODE64_DEST_LEN)    * ENCODE64_SOURCE_LEN
;   Jump table entries for finalization
Tbl.JmpEncode64:
    dd       Encode64Chunks.Finish.0
    dd       Encode64Chunks.Finish.1
    dd       Encode64Chunks.Finish.2
; <<<<<<<<<<<<<<<<<<<<<<<<<<<<<<<<<<<<<<<<<<<<<<<<<<<<<<
; <<<<<<<<<<<<<<<<<  START OF FUNCTION  <<<<<<<<<<<<<<<<<<<<
; <<<<<<<<<<<<<<<<<<<<<<<<<<<<<<<<<<<<<<<<<<<<<<<<<<<<<<
;   Encode64Chunks - Perform Base64 encoding of src data
;       Use 76-byte blocks, CR/LF at the end of each line
;   Input:
;      Source   - points to source to encode
;      Dest     - points to buffer sufficient to hold output
;      Size     - number of source bytes
;   Output:
;      eax      - points to output buffer of encoded bytes
;      ecx      - size (in bytes) of output
proc Encode64Chunks Dest, Source, Size
;   Could encode as one stream, but normally will need to
;   encode in 76-byte chunks below...
    push   ebx
    push   esi
    push   edi
    push   ebp
```

```
        mov    esi,   [Source]          ; Points to source to encode
        mov    edi,   [Dest]            ; output buffer
        mov    ebp,   [Size]            ; # bytes to handle; since this
                                        ;   uses the ebp register, it
                                        ;   should be the last loaded
        neg    ebp                      ; is it zero?
        jz     .SizeIs0
;   At this point, ebp is negative total # bytes...
;       ecx will be used for internal loop counter to
;       determine at what point to add CR/LF pair
        mov         ecx, -ENCODE64_BLOCKSIZE_SOURCEBYTES
            ; denote in terms of source bytes
        cmp         ecx, ebp
        cmovl       ecx, ebp            ; restrict to minimum chars to
                                        ; process
        ; Prepare esi and edi for this logic...
        ;       make them point to the end of the block to enable
        ;       smaller, faster end-of-loop logic
sub     esi,   ecx
sub     ebp,   ecx
.GotCount:
        ; mov        ebx, [Tbl.Encode64.24Bits]
        ; point to huge allocated table
        jmp    .MainLoop                ; this should be aligned
        ; Need to handle total size, and for last
        ;   24 bits of source, need to handle very carefully
        ;   via jump tables at the end
align 16
; Process three bytes in this loop. Aligned for faster
;   looping back up to MainLoop address. Could be
;   unrolled to handle six or nine or twelve (any
;   multiple of three)source bytes at a time, test
;   timings for best performance
; Other encoding methods will replace code between the
;   .MainLoop and .EndOfCoreProcess labels, while the
;   remaining code will be the same (additional tables
;   may also be used by the other encoding methods)
.MainLoop:
; 15 instructions + 4 = 19 instructions in inner loop,
;   256-byte table
; avg: 542 MB/sec (Mar. 7, 2013)
        mov    eax,   [esi + ecx]       ; get 24 bits,
        ; process 6 bits at a time)
        bswap       eax ; convert from little- to big-endian
        ; work on 6-bit chunks in reverse order since 4$^{th}$
        ; group is in lowest position...
        shr    eax,   8                 ; isolate 4th
        movzx       ebx, al             ; get 4th
        shr    eax,   6                 ; isolate 3rd
        mov    dh,    [Tbl.Encode64.First + ebx] ; encode 4th
        movzx       ebx, al             ; get 3rd
        shr    eax,   6                 ; isolate 2nd
        mov    dl,    [Tbl.Encode64.First + ebx] ; encode 3rd
        shl    edx,   16                ; shift into position
        movzx  ebx, al                  ; get 2nd
        shr    eax,   6                 ; isolate 1st
        mov    dh,    [Tbl.Encode64.First + ebx] ; encode 2nd
        movzx       ebx, al             ; get 1st
        mov    dl,    [Tbl.Encode64.First + ebx] ; encode 1st
        ; Need some settling time for full edx to become
        ;       available after adjusting portion of full register
        ;       (small penalty for writing to portion of register)
.EndOfCoreProcess:
        ; Show we just finished three more chars
        add    edi, 4 ; account for chars written
        add    ecx, ENCODE64_SOURCE_LEN
            ; edx should now be ready to write
        mov    [edi – 4], edx           ; write the four encoded bytes...
        js     .MainLoop
        ; At this point, if ebp !=0, we need to do
        ;       cr/lf pair and continue
        test   ebp,   ebp               ; if 0, we are finished
        jz     .FinishUp                ; finished, so determine how to end
;.HandleNewLine:
; At this point, add cr/lf
        mov    eax,   0x0a0d
        mov    word [edi], ax           ; cr/lf
        add    edi,   2                 ; account for cr/lf just written
```

```
            ; Now, prepare for next loop
            mov    ecx,   -ENCODE64_BLOCKSIZE_SOURCEBYTES
            cmp    ecx,   ebp
            cmovl  ecx, ebp              ; restrict to min chars to process
            ; Prepare esi and edi for this logic...
            ;   make them point to the end of the block
            sub    esi,   ecx
            sub    ebp,   ecx
            jmp    .MainLoop             ; this should be aligned
; At this point, we will have processed 0, one,
;       or two chars too many... determine which case
align 16
.FinishUp:
; ecx will be 0, 1, or 2; jump table branches to
;       appropriate destination based on ecx
            jmp dword [Tbl.Encode64.First + ebx * 4]
align 16
.Finish.0:
; Normal finish, nothing left to do
            mov    byte   [edi], 0
            pop    ebp
            mov    eax,   [Dest]             ; return ptr to buffer
            sub    edi,   eax
            mov    ecx,   edi                ; length written to output
            pop    edi
            pop    esi
            pop    ebx
            ret
align 16
.Finish.1:
; Read one byte too many, so adjust
            movzx eax, byte [edi − 1]         ; read last valid byte
            shl    eax,   2             ; adjust lower bits, puts 0's to right
            and    eax,   0x3f          ; isolate low six bits, this is index
            movzx      edx, byte [Tbl.Encode64.First + ebx] ; encode
            or     edx,   0x3d00             ; insert equal sign as second byte
            mov    word [edi − 2], dx        ; adjust last 2 encoded bytes
            ; now finish up and return buffer and size
            mov    byte   [edi], 0
            pop    ebp                       ; permits access of local vars
            mov    eax,   [Dest]             ; return ptr to buffer
            sub    edi,   eax
            mov    ecx,   edi                ; add one more byte to length
            pop    edi
            pop    esi
            pop    ebx
            ret
align 16
.Finish.2:
; Read two bytes too many, so adjust
            movzx eax, byte [esi − 1]         ; read last valid byte again
            shl    eax,   4
            and    ax,    0x3f
            movzx      edx, byte [Tbl.Encode64.First + eax ]
            or     edx,   0x3d3d00           ; insert two equal signs
            mov    [edi − 3],    edx         ; rewrite last three bytes
            ; -- and edi is already two bytes into offset
            ; now finish up and return buffer and size
            mov    byte   [edi], 0
            pop    ebp
            mov    eax,   [Dest]             ; return ptr to buffer
            sub    edi,   eax
            mov    ecx,   edi                ; add 2 bytes to get proper length
            pop    edi
            pop    esi
            pop    ebx
            ret
align 16
.SizeIs0:
; Jump here if no source bytes to encode
            xor    ecx,   ecx
            mov    eax,   edi
            mov    byte   [edi], cl          ; Make first output byte '0'
            pop           edi
            pop           esi
            pop           ebx
            ret
endp
```

Code Example 2

```
;<<<<<<<<<<<<<<<<<<<<<<<<<<<<<<<<<<<<<<<<<<<<<<<<<<<<<<<
;<<<<<<<<<<<<<<<<<<<< Encode64_E_Unrolled <<<<<<<<<<<<<<<<<<<<
;<<<<<<<<<<<<<<<<<<<    (aka Encode64-F)   <<<<<<<<<<<<<<<<<<<
;<<<<<<<<<<<<<<<<<<<<<<<<<<<<<<<<<<<<<<<<<<<<<<<<<<<<<<<
; This function performs Base64 encoding via two tables:
; a 256-byte table for encoding the first output byte, and a
; 1MB table for encoding the three remaining output bytes.
; No CR/LF pairs are inserted, and the core loop is unrolled
; UNROLL_COUNT times
; Input:
;   Source          - points to source to encode
;   Dest            - points to buffer sufficient to hold output
;   Size            - number of source bytes
; Output:
;   eax             - points to output buffer of encoded bytes
;   ecx             - size (in bytes) of output
UNROLL_COUNT = 8                            ; #times unrolled below
; manually unrolled to include various optimizations
UnrollDivisor dd UNROLL_COUNT * ENCODE64_SOURCE_LEN
align 16
proc Encode64_E_Unrolled Dest, Source, Size
; Encode as one stream...
    push    ebx
    push    esi
    push    edi
    push    ebp
    mov     esi,    [Source]        ; Points to source to encode
    mov     edi,    [Dest]          ; output buffer
    mov     eax,    [Size]          ; #bytes to handle
    test    eax,    eax             ; is it zero?
    jz      .SizeIs0
; Count is > 0, so determine number of loops...
;   if any remainder, let Encode64Chunks handle it
    xor     edx,    edx
    div     [UnrollDivisor]
    push    edx                     ; preserve remainder
    mul     [UnrollDivisor]         ; mult to determine exact
; number of source bytes handled here
    mov     ecx,    eax
    neg     ecx
    jz      .AlmostDone             ; handle remainder, not much left
; At this point, ecx is negative total loops...
; Prepare esi and edi for this logic...
; make them point to the end of the block
    sub     esi,    ecx
; Load ptr to huge conversion table...
    mov     ebx,    [Tbl.Encode64.24Bits]       ; point to huge table
    jmp     .MainLoop                           ; this should be aligned
align 16
.MainLoop:
URC = 0             ; Unrolled source counter
UDC = 0             ; Unrolled dest counter
; Two loops unrolled
    movzx   eax,    byte [esi + ecx + ENCODE64_SOURCE_LEN * URC]
                    ; get first byte
    movzx   ebx,    byte [esi + ecx+ ENCODE64_SOURCE_LEN*(URC + 1)]
                    ; get first byte
    movzx           edx, byte [Tbl.Encode64.FirstNoBSWAP + eax ]
    movzx           ebp, byte [Tbl.Encode64.FirstNoBSWAP + ebx ]
    and     eax,    3                   ; isolate two low bits
    and     ebx,    3                   ; isolate two low bits
    shl     eax,    16
    shl     ebx,    16
    mov     ax, word [esi + ecx + ENCODE64_SOURCE_LEN * URC + 1]
; get next two bytes
    mov     bx, word [esi+ecx+ENCODE64_SOURCE_LEN*(URC + 1) + 1]
; get next two bytes
    or      edx, dword [Tbl.Encode64.SecondNoBSWAP + eax * 4]
    or      ebp, dword [Tbl.Encode64.SecondNoBSWAP + ebx * 4]
    mov     [edi + ENCODE64_DEST_LEN * UDC], edx
    mov     [edi + ENCODE64_DEST_LEN * (UDC + 1)], ebp
URC = URC + 2
UDC = UDC + 2
```

```
; Another two loops unrolled
    movzx   eax,    byte [esi + ecx + ENCODE64_SOURCE_LEN * URC]
                            ; get first byte
    movzx   ebx,    byte [esi + ecx + ENCODE64_SOURCE_LEN*(URC +
1)]
                            ; get first byte
    movzx           edx, byte [Tbl.Encode64.FirstNoBSWAP + eax]
    movzx           ebp, byte [Tbl.Encode64.FirstNoBSWAP + ebx]
    and     eax,    3                   ; isolate two low bits
    and     ebx,    3                   ; isolate two low bits
    shl     eax,    16
    shl     ebx,    16
    mov     ax, word [esi + ecx + ENCODE64_SOURCE_LEN * URC +
1]
; get next two bytes
    mov     bx, word [esi+ecx+ENCODE64_SOURCE_LEN*(URC + 1) +
1]
; get next two bytes
    or      edx, dword [Tbl.Encode64.SecondNoBSWAP + eax * 4]
    or      ebp, dword [Tbl.Encode64.SecondNoBSWAP + ebx * 4]
    mov     [edi + ENCODE64_DEST_LEN * UDC], edx
    mov     [edi + ENCODE64_DEST_LEN * (UDC + 1)], ebp
URC = URC + 2
UDC = UDC + 2
; Another two loops unrolled
    movzx   eax,    byte [esi + ecx + ENCODE64_SOURCE_LEN * URC +
                            ; get first byte
    movzx   ebx,    byte [esi +ecx+ENCODE64_SOURCE_LEN*(URC +
1)]
                            ; get first byte
    movzx           edx, byte [Tbl.Encode64.FirstNoBSWAP + eax ]
    movzx           ebp, byte [Tbl.Encode64.FirstNoBSWAP + ebx ]
    and     eax,    3                   ; isolate two low bits
    and     ebx,    3                   ; isolate two low bits
    shl     eax,    16
    shl     ebx,    16
    mov     ax, word [esi + ecx + ENCODE64_SOURCE_LEN * URC +
1]
; get next two bytes
    mov     bx, word [esi+ecx+ENCODE64_SOURCE_LEN*(URC + 1) +
1]
; get next two bytes
    or      edx, dword [Tbl.Encode64.SecondNoBSWAP + eax * 4]
    or      ebp, dword [Tbl.Encode64.SecondNoBSWAP + eax * 4]
    mov     [edi + ENCODE64_DEST_LEN * UDC], edx
    mov     [edi + ENCODE64_DEST_LEN * (UDC + 1)], ebp
URC = URC + 2
UDC = UDC + 2
; Another two loops unrolled
    movzx   eax,    byte [esi + ecx + ENCODE64_SOURCE_LEN * URC]
                            ; get first byte
    movzx   ebx,    byte [esi + ecx+ENCODE64_SOURCE_LEN*(URC +
1)]
                            ; get first byte
    movzx           edx, byte [Tbl.Encode64.FirstNoBSWAP + eax ]
    movzx           ebp, byte [Tbl.Encode64.FirstNoBSWAP + ebx ]
    and     eax,    3                   ; isolate two low bits
    and     ebx,    3                   ; isolate two low bits
    shl     eax,    16
    shl     ebx,    16
    mov     ax, word [esi + ecx + ENCODE64_SOURCE_LEN * URC +
1]
; get next two bytes
    mov     bx, word [esi+ecx+ENCODE64_SOURCE_LEN*(URC + 1) +
1]
; get next two bytes
    or      edx, dword [Tbl.Encode64.SecondNoBSWAP + eax * 4]
    or      ebp, dword [Tbl.Encode64.SecondNoBSWAP + eax * 4]
    mov     [edi + ENCODE64_DEST_LEN * UDC], edx
    mov     [edi + ENCODE64_DEST_LEN * (UDC + 1)], ebp
URC = URC + 2
UDC = UDC + 2
.EndOfCoreProcess:
    ; Show we just finished three more chars
    add     edi, ENCODE64_DEST_LEN* UNROLL_COUNT
```

-continued

```
; adjust since we write 4 chars for each 3 read
    add     ecx,        ENCODE64_SOURCE_LEN * UNROLL_COUNT
    js      .MainLoop
.AlmostDone:
    ; At this point, we have fewer than
    ;   UNROLL_COUNT * ENCODE64_SOURCE_LEN bytes to process;
; if 0, we're done, else jump to Encode64Chunks to finish
    pop     ebp                 ; remainder. . . see if anything left
    test    ebp,        ebp
    jz      .Finish.0           ; nothing remaining, so all is finished
    ; More source bytes; adjust regs, jmp to Encode64Chunks
    neg     ebp
    ; Now, prepare for next loop
    mov     ecx,        -ENCODE64_BLOCKSIZE_SOURCEBYTES
    cmp     ecx,        ebp
    cmovl   ecx,        ebp             ; restrict to min chars to process
    ; Prepare esi and edi for this logic. . . make them
; point to the end of the block as expected
    sub     esi,        ecx
    sub     ebp,        ecx
; Now, jump to other function that handles small counts and
; cleans up
    jmp     Encode64Chunks.GotCount              ; this should be aligned
align 16
.Finish.0:
; Normal finish, nothing left to do
    mov     byte [edi], 0 ; not needed, but some
    ; implementations prefer terminating 0 in output buf
; Clean up, restore regs, return necessary info
    pop     ebp
    mov     eax,        [Dest]              ; return ptr to buffer
    sub     edi,        eax
    mov     ecx,        edi                 ; length written to output
    pop     edi
    pop     esi
    pop     ebx
    ret
align 16
; Come here if size is 0, nothing to do
.SizeIs0:
    xor     ecx,        ecx
    mov     eax,        edi
    mov     byte        [edi], cl           ; Make first output byte
'0'
    pop     ebp
    pop     edi
    pop     esi
    pop     ebx
    ret
endp
;>>>>>>>>>>>   END OF Encode64_E_Unrolled  >>>>>>>>>>>>>>>>>>>>>
```

Code Example 3

```
;<<<<<<<<<<<<<<<<<<<<<<<<<<<<<<<<<<<<<<<<<<<<<<<<<<<<<<<
;<<<<<<<<<<<<   START OF Decode64 Bytes    <<<<<<<<<<<<<<<<<<<<<
;<<<<<<<<<<<<<<<<<<<<<<<<<<<<<<<<<<<<<<<<<<<<<<<<<<<<<<<
; Copyright (c) NumberGun, LLC. All rights reserved
; Uses small 256-byte decode table.
; Handles CR/LF if first one or two bytes, otherwise ignores
; invalid chars. Properly handles '=' at 3rd or 4th
; position.
; EDX will be used to accumulate the value
; Input:
;   Dest            - output buffer; if null, a buffer will be
;                           allocated after counting first
;   Src             - points to the Base64-encoded source in memory;
;   SrcSize             - #bytes in Src
; Output:
;   eax    - points to output buffer, or is 0 on failure
;   ecx    - number of bytes in decoded buffer
align 16
proc Decode64_Bytes Dest, Src, SrcSize
    pushregs ebx, esi, edi
```

```
; Process one byte at a time, controlled, no CR/LF chars
    mov     ecx,        [SrcSize]
    test    ecx,        ecx
    jz      .SizeIs0
; There is valid data, so preserve regs and load parms
    pushregs ebx, esi, edi
    mov     edi,        [Dest]
    mov     esi,        [Src]
    neg     ecx
    sub     esi,        ecx
    jmp     .MainLoop
align 4
.SizeIs0:
    mov     eax,        [Dest]
    mov     byte        [eax], 0
    ret
align 4
.Equals.3:
; '=' in third byte, so finish
    bswap               edx
    and     edx,        0xff ; mask off for 1 byte
    mov     [edi],      edx
    mov     eax,        [Dest]
    sub     edi,        eax
    lea     ecx,        [edi + 1]
    popregs             ebx, esi, edi
    ret
align 4
.Equals.4:
; '=' in fourth byte, so finish
    ; Need to decode, shift, and or 3rd byte
    movzx               eax, byte [Tbl.Decode.Char + eax]
    shl     eax,        14
    or      edx,        eax
    bswap               edx
    and     edx,        0xffff          ;   mask for 2 bytes
    mov     [edi],      edx
    mov     eax,        [Dest]
    sub     edi,        eax
    lea     ecx,        [edi + 2]
    popregs             ebx, esi, edi
    ret
.SkipByte:
    inc     ecx                         ; skip over byte
.MainLoop:                  ; 28 instructions
    movzx               eax, byte [esi + ecx] ; 1st byte
    ; Skip over if CR or LF
    cmp     al,         CR
    je      .SkipByte
    cmp     al,         LF
    je      .SkipByte
    movzx               ebx, byte   [esi + ecx + 1] ; 2nd byte
    ; Decode first byte
    movzx               edx, byte   [Tbl.Decode.Char + eax]
    ; Decode second byte
    movzx               ebx, byte   [Tbl.Decode.Char + ebx]
    shl     edx,        26              ; 1st byte into position
    shl     ebx,        20              ; 2nd byte into position
    movzx               eax, byte [esi + ecx + 2] ; 3rd byte
    or      edx,        ebx             ; combine 1st and 2nd
    movzx               ebx, byte [esi + ecx + 3] ; 4th byte
    cmp     al,         '='             ; in 3rd byte?
    je      .Equals.3
    cmp     bl,         '='             ; in 4th byte?
    je      .Equals.4
    ; Decode 3rd byte
    movzx               eax, byte       [Tbl.Decode.Char + eax]
    ; Decode 4th byte
    movzx               ebx, byte       [Tbl.Decode.Char + ebx]
    shl     eax,        14              ; 3rd byte into position
    shl     ebx,        8               ; 4th byte into position
    ; combine 3rd and 4th
    or      edx,        eax
    or      edx,        ebx
```

-continued

```
    bswap       edx             ; prepare to write
    add         edi,        3
    add         ecx,        4
    mov         [edi – 3], edx
                                ; edi was prematurely adjusted to help speed up
                                ; process, so negative offset needed here
    js          .MainLoop       ; continue while ecx < 0
; No extra bytes, so clean up and exit
    mov         eax,        [Dest]
    sub         edi,        eax
    mov         ecx,        edi
    popregs ebx, esi, edi
    ret
endp
;
;>>>>>>>>>>>>>>   END OF Decode64_Bytes   >>>>>>>>>>>>>>>>>>>>
;
```

Code Example 4

```
;<<<<<<<<<<<<<<<<<<<<<<<<<<<<<<<<<<<<<<<<<<<<<<<<<<<<<<<<<<<<<
;<<<<<<<<<<<<<<   START OF Decode64_Words   <<<<<<<<<<<<<<<<<<<<<<
;<<<<<<<<<<<<<<<<<<<<<<<<<<<<<<<<<<<<<<<<<<<<<<<<<<<<<<<<<<<<<
; Copyright (c) NumberGun, LLC. All rights reserved
; Uses two large tables: 128k for first two bytes, and 256k
; for next two bytes. Tables are designed to eliminate the
; need for BSWAP. Handles CR/LF if first one or two bytes,
; doesn't screen for other invalid chars. Does properly
; interpret '=' at 3rd or 4th position to end decoding.
; EDX will be used to accumulate the value
; Input:
;   Dest           - output buffer; if null, a buffer will be
allocated
;   Src            - points to the Base64-encoded source in memory
;   SrcSize        - # bytes in Src
; Output:
;   eax    - points to output buffer, or is 0 on failure
;   ecx    - number of bytes in decoded buffer
;lign 16
proc Decode64_Words Dest, Src, SrcSize
    pushregs ebx, esi, edi
; Process two bytes at a time, very controlled, CR/LF chars
; checked for only at start of new four-byte source group
    mov         ecx,        [SrcSize]
    test        ecx,        ecx
    jz          .SizeIs0
; There is valid data, so preserve regs and load parms
    pushregs ebx, esi, edi
    mov         edi,        [Dest]
    mov         esi,        [Src]
    neg         ecx                     ; use as counter, index for esi
    sub         esi, ecx
    jmp         .MainLoop
.SkipCRLF:
    cmp         ah,         CR          ; is 2nd byte CR or LF?
    je          .SkipTwo
    cmp         ah,         LF
    jne         .SkipOne
.SkipTwo:
    inc         ecx
.SkipOne:
    inc         ecx                     ; skip over byte
.MainLoop:                              ; 16 instructions
    movzx                   eax, word [esi + ecx] ; 1st word
    ; Skip over if CR or LF
    cmp         al,         CR
    je          .SkipCRLF
    cmp         al,         LF
    je          .SkipCRLF
    movzx                   ebx, word [esi + ecx + 2] ; 2nd word
    movzx                   edx, word [Tbl.Decode.1stWord + eax * 2]
    cmp         bl,         '='         ; in 3rd byte?
    je          .Equals.3
```

```
; Convert remainder
    or      edx, dword [Tbl.Decode.1stWord + ebx * 4]
    cmp     bh,         '='             ; in 4th byte?
    je      .Equals.4
    add     edi,        3
    add     ecx,        4
    mov     [edi – 3], edx
    js      .MainLoop ; continue while ecx < 0
; No extra bytes, so clean up and exit
    mov     eax,        [Dest]
    sub     edi,        eax
    mov     ecx,        edi
    popregs ebx, esi, edi
    ret
align 4
.SizeIs0:
    mov     eax,        [Dest]
    mov     byte        [eax], 0
    ret
align 4
.Equals.3:
; '=' in third byte, so finish
; already properly encoded, so store
    mov     [edi],      edx
    mov     eax,        [Dest]
    sub     edi,        eax
    lea     ecx,        [edi + 1]       ; show one more output byte
    popregs             ebx, esi, edi
    ret
align 4
.Equals.4:
; '=' in fourth byte, so finish
; already properly encoded, so store
    mov     [edi],      edx
    mov     eax,        [Dest]
    sub     edi,        eax
    lea     ecx,        [edi + 2]       ; show two more output bytes
    popregs             ebx, esi, edi
    ret
endp
;
;>>>>>>>>>>>>>>>>  END OF Decode64_Words  >>>>>>>>>>>>>>>>>>>>>>
;
```

The invention claimed is:

1. A computer-readable storage medium configured with data and with instructions that when executed by at least one processor causes the processor(s) to perform a technical process for Base64 encoding on little-endian processor systems, the process comprising the steps of:

using at least one instruction of a little-endian processor to concurrently read into a register of the little-endian processor at least two bytes of data from a data source; and encoding the at least two bytes of data according to a table which is compliant with at least one Base64 encoding standard.

2. The computer-readable storage medium of claim 1, wherein the process uses a single processor instruction to read at least two bytes of data into the register of the little-endian processor.

3. The computer-readable storage medium of claim 1, wherein the process uses a single processor instruction to read at least four bytes of data into the register of the little-endian processor.

4. The computer-readable storage medium of claim 1, wherein the process is free of bit shifting operations that are used in a contrasting Base64-encoding procedure which comprises (a) reading only a single byte from a data source, (b) shifting bits, (c) encoding, and repeating steps (a), (b), (c) in that order multiple times.

5. The computer-readable storage medium of claim 1, wherein the process is free of bit masking operations that are used in a contrasting Base64-encoding procedure which comprises (a) reading only a single byte from a data source, (b) masking bits, (c) encoding, and repeating steps (a), (b), (c) in that order multiple times.

6. The computer-readable storage medium of claim 1, wherein the process is free of conditional operations that are used in a contrasting Base64-encoding procedure which comprises using conditional statements where the claimed process uses look-up tables instead.

7. The computer-readable storage medium of claim 1, wherein the process further comprises adding two nulls at the end of the data from the data source.

8. The computer-readable storage medium of claim 1, wherein the process overloads at least one register or variable so that only two registers or other variables are used to simultaneously store values for the following three items: a counter, a source index, a destination index.

9. The computer-readable storage medium of claim 8, wherein a negative value is used in the process simultaneously as a counter and as at least one of: a source index, a destination index.

10. A system comprising:
at least one processor;
a memory in operable communication with the processor(s) and containing instructions and at least one table for Base64 data management, wherein the system is further characterized in at least two of the following ways:

(a) the instructions comprise instructions for a Base64 encoding process which relies on only a single bit shifting operation;
(b) the instructions comprise instructions for a Base64 encoding process which does not rely on any bit shifting operation;
(c) the instructions comprise instructions for a Base64 encoding process which does not rely on any bit shifting operation of data source bytes that are accessed in a single multi-byte read operation prior to using those data source bytes as indexes into an encoding lookup table;
(d) the instructions comprise instructions for a Base64 encoding process which accesses source data bytes multiple bytes at a time and then encodes those accessed bytes before accessing additional multiple bytes and then encoding those accessed bytes;
(e) the tables effectively shift bits from 8-bit sources into location for 6-bit output, thereby avoiding shift operations in instructions for a Base64 encoding process;
(f) the instructions comprise instructions for a Base64 encoding process which adds one or two nulls at the end of a data source;
(g) the instructions comprise instructions for Base64 encoding according to a set of 64 encoding values, and the at least one table includes a table having four quadrants, each of which contains a copy of the same 64 encoding values;
(h) the instructions comprise instructions for performing a Base64 encoding process which uses a counter register of the processor as an index;
(i) the instructions comprise instructions for performing a Base64 encoding process which uses a negative value for a counter register which is simultaneously used as an index;
(j) the instructions comprise instructions for performing a Base64 decoding process which uses a counter register of the processor as an index;
(k) the instructions comprise instructions for performing a Base64 decoding process which uses a negative value for a counter register which is simultaneously used as an index;
(l) the processor is a little-endian processor, and the table(s) effectively eliminate any need for a BSWAP command in instructions for a Base64 encoding process;
(m) the system comprises data source partitioning instructions which partition a data source into N partitions, N being an integer greater than 1, with each of the first N−1 partitions having a length in bytes which is a multiple of three, and wherein the system further comprises encoding concurrency instructions which Base64-encode the partitions concurrently;
(n) the system comprises data source partitioning instructions which partition a data source into N partitions of data, and the length of each partition is calculated based on a relative expected performance of a processor to which the partition of data will be sent for encoding.

11. The system of claim 10, wherein the system is characterized in at least three of the listed ways.

12. The system of claim 10, wherein the system is characterized in at least four of the listed ways.

13. The system of claim 10, wherein the system is characterized in at least five of the listed ways.

14. The system of claim 10, wherein the system is characterized in at least six of the listed ways.

15. The system of claim 10, wherein the system is characterized in at least seven of the listed ways.

16. The system of claim 10, wherein the system is characterized in at least eight of the listed ways.

17. The system of claim 10, wherein the system is characterized in at least nine of the listed ways.

18. The system of claim 10, wherein the system is characterized in at least ten of the listed ways.

\* \* \* \* \*